United States Patent [19]

Kageyama et al.

[11] Patent Number: 5,395,446
[45] Date of Patent: Mar. 7, 1995

[54] SEMICONDUCTOR TREATMENT APPARATUS

[75] Inventors: Mokuji Kageyama, Yokohama; Kiyoshi Yoshikawa, Kawasaki; Ayako Shimazaki, Tokyo, all of Japan

[73] Assignee: Kabushiki Kaisha Toshiba, Asaki, Japan

[21] Appl. No.: 161,095

[22] Filed: Dec. 3, 1993

Related U.S. Application Data

[63] Continuation of Ser. No. 645,321, Jan. 24, 1991, abandoned, which is a continuation-in-part of Ser. No. 439,845, Nov. 21, 1989, abandoned.

[30] Foreign Application Priority Data

Nov. 21, 1988 [JP]  Japan ................... 63-293888

[51] Int. Cl.[6] ........................................... B05C 11/00
[52] U.S. Cl. ........................................ 118/52; 118/56; 118/409; 118/421; 118/500
[58] Field of Search ............... 422/110, 293, 299, 300; 134/902, 66; 118/52, 56, 409, 401, 421, 500; 141/98, 130; 156/345; 901/6; 414/225

[56]  References Cited

U.S. PATENT DOCUMENTS

| 3,760,822 | 9/1973 | Evans | 118/52 |
|---|---|---|---|
| 3,810,779 | 5/1974 | Pickett et al. | 118/401 |
| 3,933,187 | 1/1976 | Marlinski | 118/401 |
| 4,060,097 | 11/1977 | Oxford | 156/345 |
| 4,075,974 | 2/1978 | Plows et al. | 118/52 |
| 4,501,527 | 2/1985 | Jacoby et al. | 414/225 |
| 4,564,280 | 1/1986 | Fukuda | 134/144 |
| 4,584,886 | 4/1986 | Matsunaga et al. | 422/299 |
| 4,634,497 | 1/1987 | Shimazaki | 156/646 |
| 4,695,327 | 9/1987 | Grebinski | 134/11 |
| 4,705,951 | 11/1987 | Layman et al. | 414/225 |
| 4,746,256 | 5/1988 | Boyle et al. | 414/225 |
| 4,790,262 | 12/1988 | Nakayama et al. | 118/58 |
| 4,800,836 | 1/1989 | Yamamoto et al. | 118/52 |
| 4,816,638 | 3/1989 | Ukai et al. | 156/345 |
| 4,822,639 | 4/1989 | Fujii et al. | 118/52 |
| 4,827,954 | 5/1989 | Layton | 134/902 |
| 4,838,979 | 6/1989 | Nishida et al. | 118/52 |
| 4,886,412 | 12/1989 | Wooding et al. | 414/225 |
| 4,891,087 | 1/1990 | Davis et al. | 156/345 |
| 4,891,488 | 1/1990 | Davis et al. | 156/345 |
| 4,944,860 | 7/1990 | Bramhall, Jr. et al. | 118/500 |

FOREIGN PATENT DOCUMENTS 0157675  10/1985  European Pat. Off. .

Primary Examiner—W. Gary Jones
Assistant Examiner—Laura E. Collins
Attorney, Agent, or Firm—Banner, Birch, McKie & Beckett

[57]  ABSTRACT

A semiconductor treatment apparatus has a gas-phase decomposing device for decomposing a gas-phase on a surface of a semiconductor substrate, a substrate supporting device for supporting the substrate, and a substrate transfer device for transferring the substrate between the gas-phase decomposing device and the substrate supporting device. The apparatus further has a liquid-drop applicator for applying a liquid-drop on the surface of the substrate supported by the substrate supporting device, with the liquid-drop being brought into contact with the surface of the substrate, and a liquid-drop preserving device for preserving the liquid-drop that has been applied to the surface of the substrate.

14 Claims, 25 Drawing Sheets

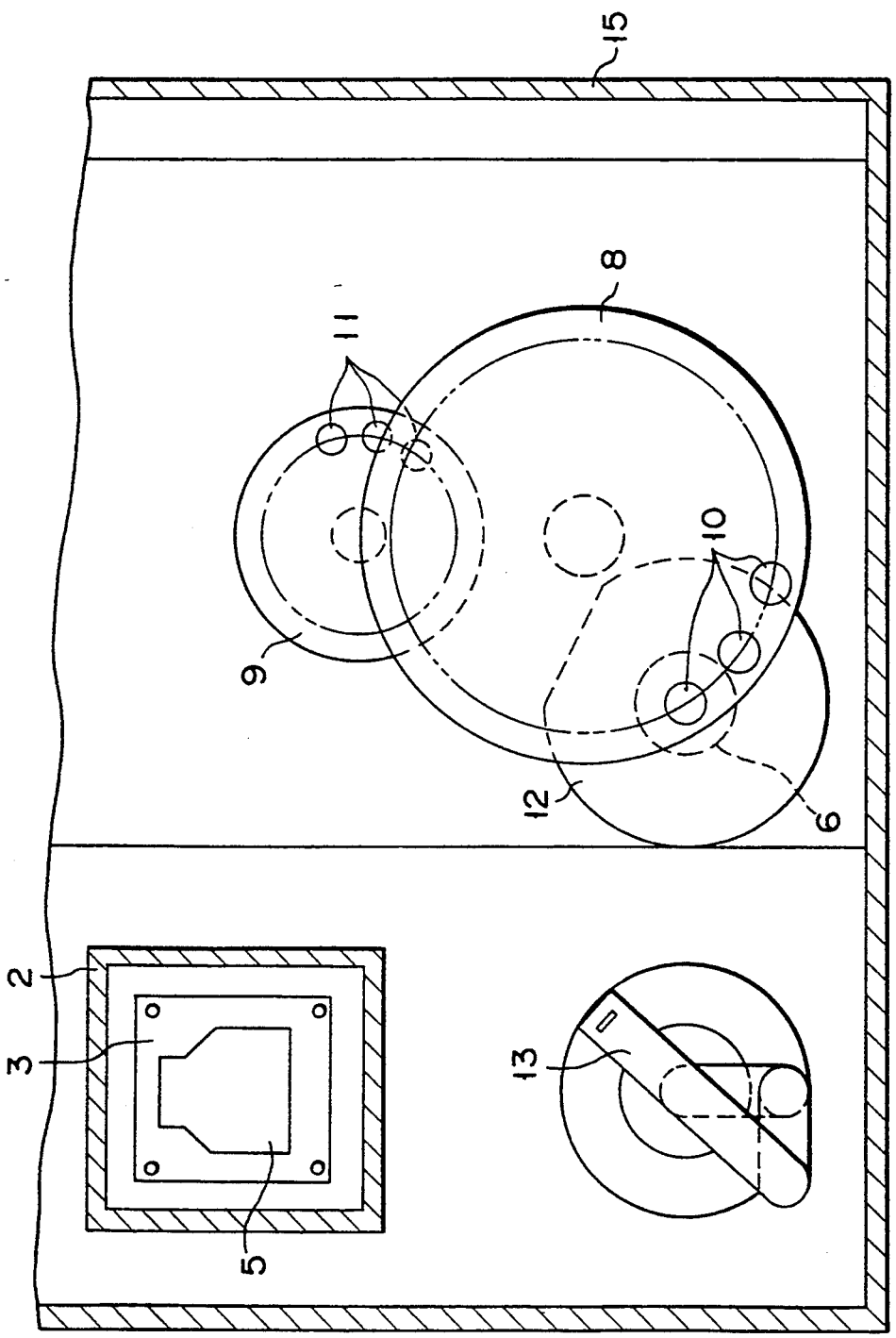

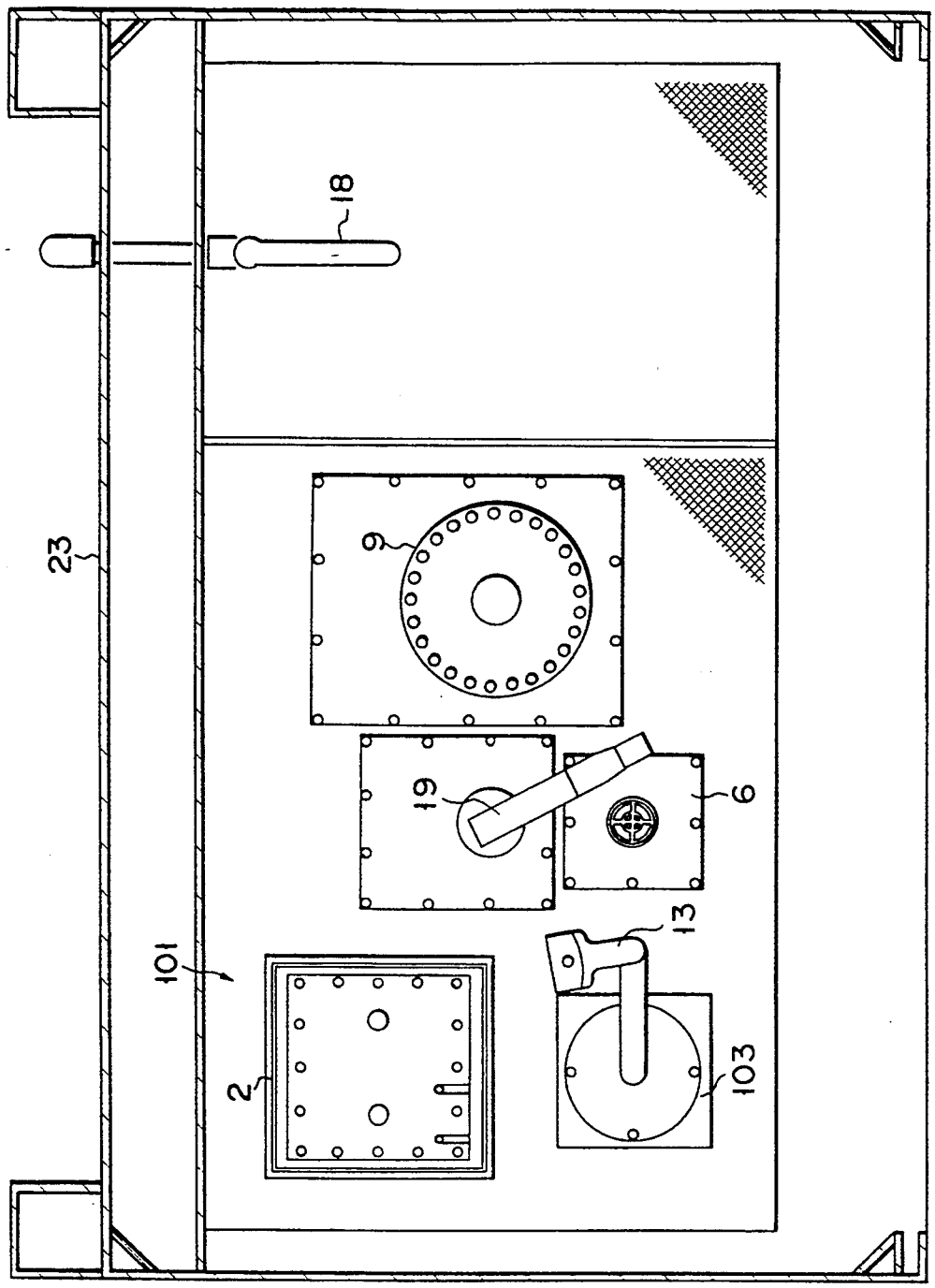

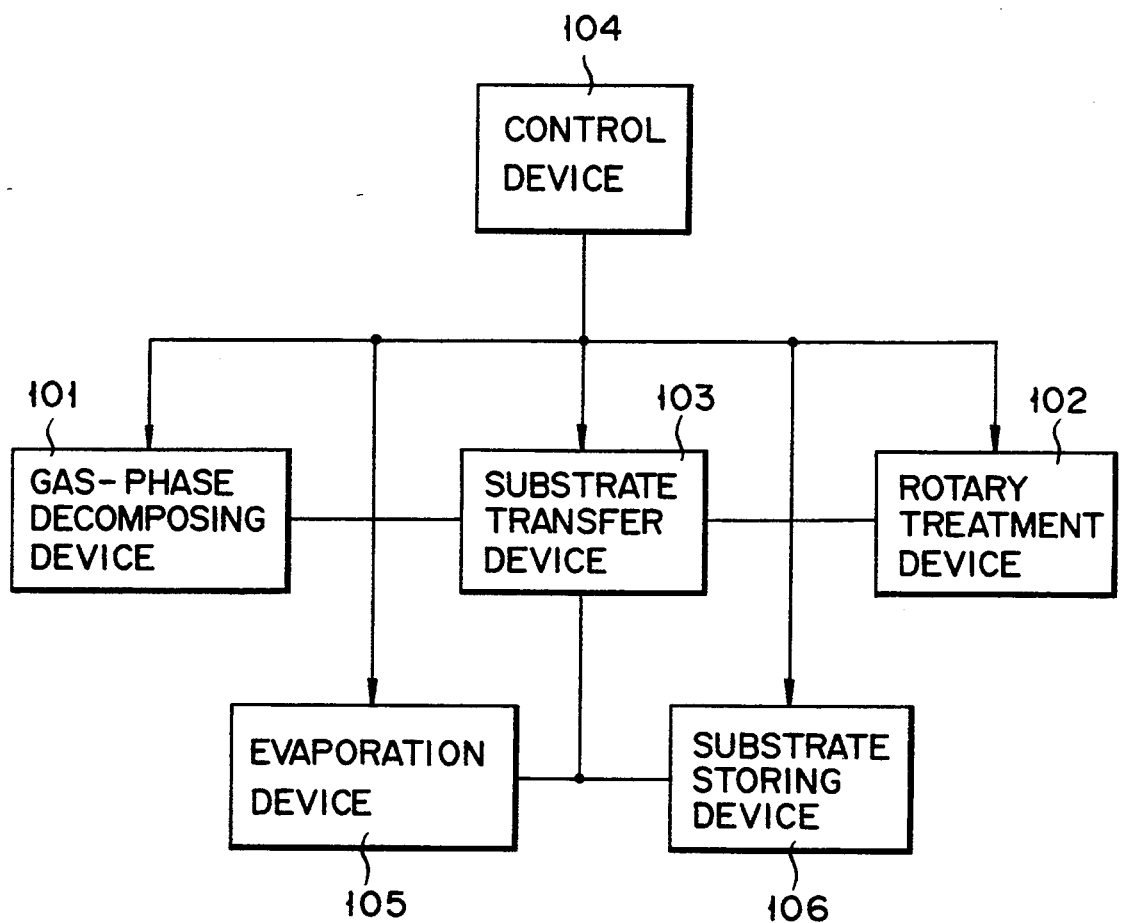
F I G. 14

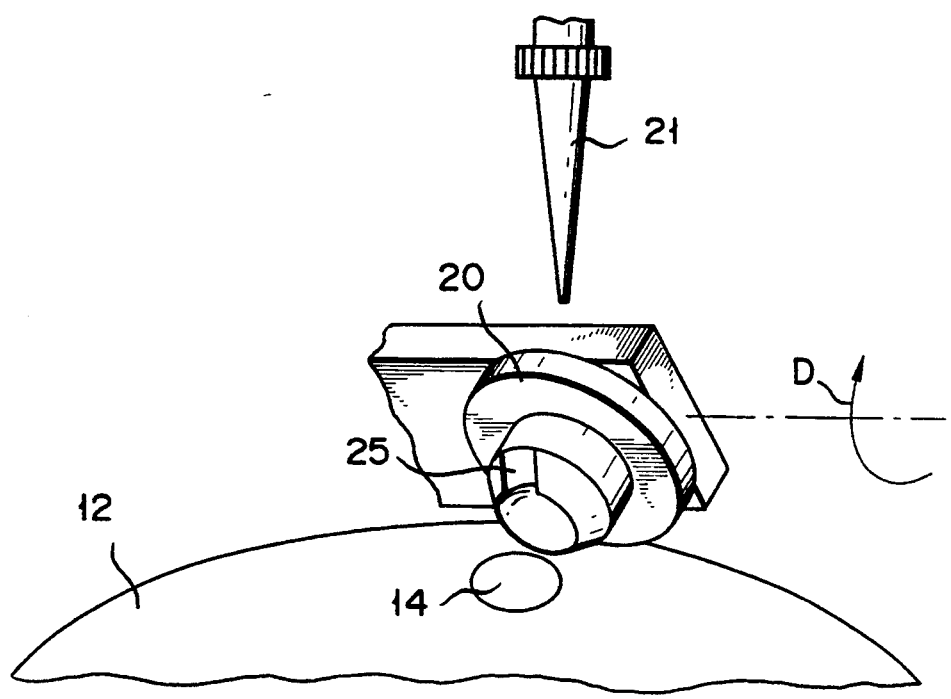
F I G. 18

SEMICONDUCTOR TREATMENT APPARATUS

CROSS REFERENCE TO THE RELATED APPLICATION

This application is a continuation of application Ser. No. 07/645,321, filed on Jan. 24, 1991, now abandoned, which is a continuation-in-part of application Ser. No. 439,845, filed on Nov. 21, 1989, now abandoned.

BACKGROUND OF THE INVENTION

1. Field of the Invention

The present invention relates generally to a semiconductor treatment apparatus, and more particularly to an apparatus for recovering impurities on the surface of a semiconductor substrate.

2. Description of the Related Art

It is well known that an impurity such as Na (sodium), K (potassium) or Fe (iron) included in a thin film thermal oxide film formed on a semiconductor substrate adversely affects the electrical characteristics of a semiconductor device, even if the amount of the impurity is very small. Thus, the electrical characteristics of the semiconductor substrate can be enhanced by preventing the impurity from being mixed in the substrate as much as possible.

As conventional methods of analyzing impurities over the surface of the semiconductor substrate, there are known secondary ion mass spectrometry (SIMS), Auger electron spectroscopy (AES), and activation analysis. These methods, however, require expensive apparatuses, and special skill is indispensable in operating such apparatuses. While these methods employ electron beams or light beams and allow local analysis, the evaluation of contamination over the entire surface of the semiconductor substrate cannot be achieved. Thus, the conventional methods are unsuitable for easy analysis of contamination of the entire surface of the substrate. Recently, as methods of analyzing the entire surface of the substrate, two methods have been proposed.

According to a first method or a gas-phase decomposing method, an appropriate thermal oxide film is formed over the surface of a substrate, and the substrate is exposed to vapor of fluoride solution. The oxide film, dissolved by the vapor of fluoride solution, is recovered, in the form of fluoride solution, along with impurities contained in the oxide film. Thus, the impurities contained in the recovered fluoride solution are analyzed by an analyzing apparatus.

According to a second method, a semiconductor substrate, which has not been subjected to a thermal oxidation treatment, is immersed in fluoride solution, and a spontaneous oxide film formed on the surface of the substrate is dissolved. The types and concentrations of impurities contained in the spontaneous oxide film are examined by analyzing the fluoride solution.

The first method, however, includes a thermal oxidation process. Thus, there is a concern that an impurity may be mixed in the formed thermal oxide film from the atmosphere employed in the thermal oxidation process, impurities over the surface of the substrate may be evaporated, or impurities may be diffused from the inner region of the substrate to the surface region of the substrate. In the second method, the amount of fluoride solution necessary for recovering the impurities is excessively greater than that necessary for analyzing the impurities. Thus, the concentration of impurities in the recovered solution is too low to obtain precise analysis data, and impurities in a spontaneous oxide film formed on the lower surface of the substrate, which is not related to impurity analysis, are mixed in the fluoride solution.

SUMMARY OF THE INVENTION

The object of the present invention is to provide a semiconductor treatment device employed in carrying out an impurity measuring method, which can analyze impurities on the surface of a semiconductor substrate, with high precision and high reliability.

In order to achieve the above object, the present invention provides a semiconductor treatment apparatus comprising a gas-phase decomposing device for decomposing the surface of a semiconductor substrate; a substrate supporting device for supporting the substrate; a substrate transfer device for transferring the substrate between the gas-phase decomposing device and the substrate supporting device; a liquid-drop applicator for applying a liquid-drop to the surface of the substrate supported by the substrate supporting device, with the liquid-drop being brought into contact with the surface of the surface of the substrate; and a liquid-drop preserving or recovering device for recovering the liquid-drop that has been applied to the surface of the substrate.

Also, the invention provides a semiconductor treatment apparatus comprising a gas-phase decomposing device for decomposing the surface of a semiconductor substrate; a substrate supporting device for supporting the substrate; a substrate transfer device for transferring the substrate between the gas-phase decomposing device and the substrate supporting device; a dripping device for dripping a liquid;

a liquid-drop retainer for retaining a liquid-drop fallen from the dripping device; a liquid-drop applicator for causing the liquid-drop retained by the liquid-drop retainer to apply to the surface of the substrate supported by the substrate supporting device; and a liquid-drop recovering device for recovering the liquid-drop that has been applied to the surface of the substrate.

BRIEF DESCRIPTION OF THE DRAWINGS

FIG. 3 is a plan view of the semiconductor treatment apparatus according to the first embodiment;

FIG. 10 is a plan view showing the semiconductor treatment apparatus arranged within the clean booth;

FIG. 14 is a block diagram illustrating a semiconductor treatment apparatus according to a third embodiment of the invention;

FIG. 18 is a perspective view, showing the liquid drop retainer in detail.

DETAILED DESCRIPTION OF THE PREFERRED EMBODIMENTS

Figure 1:
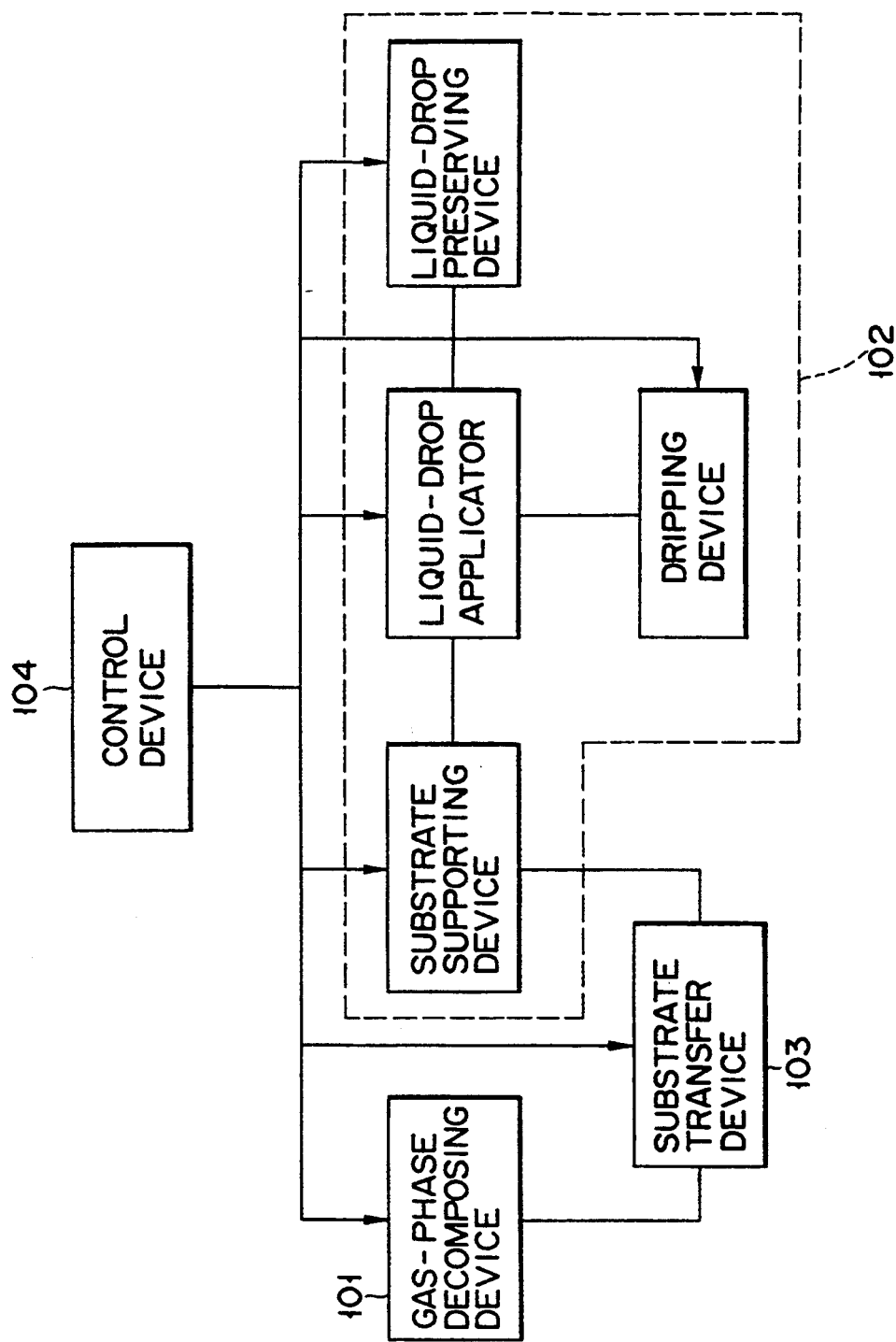
FIG. 1 is a block diagram for explaining the technical principle of a semiconductor treatment apparatus according to the present invention.

Embodiments of the present invention will now be described with reference to the accompanying drawings. In the drawings, the common elements are indicated by the same reference numeral.

FIG. 1 is a block diagram for explaining the technical principle of a semiconductor treatment apparatus according to the present invention.

In FIG. 1, a gas-phase decomposing device 101 decomposes the surface of a semiconductor substrate in a gas phase. A carrier for carrying the semiconductor substrate is arranged in the gas-phase decomposing device 101. A rotary treatment device 102 recovers impurities adhered on the surface of the semiconductor substrate. The recovery of impurities is performed by using liquid-drops. A substrate transfer device 103 is designed to transfer the semiconductor substrate between the gas-phase decomposing device 101 and the rotary treatment device 102. The substrate transfer device 103 is able to transfer one semiconductor substrate at a time. A control device 104 controls the operation timings of these devices 101, 102 and 103, for example, in a remote control mode using computer programs.

Figure 2:
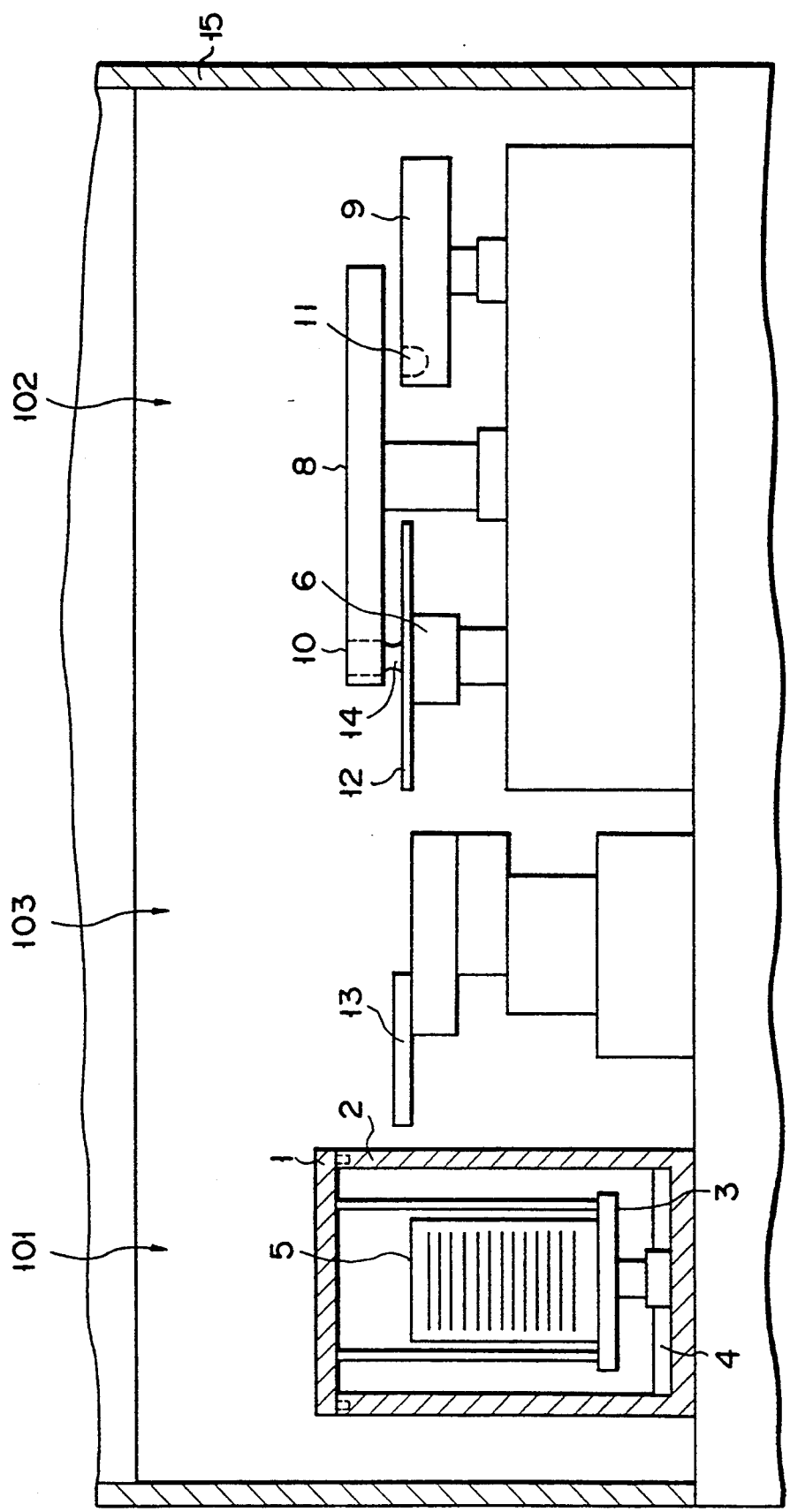
FIG. 2 is a side view of a semiconductor treatment apparatus according to a first embodiment of the present invention.

FIGS. 2 and 3 show a first embodiment of the semiconductor treatment apparatus according to the present invention. FIG. 2 is a side view showing various devices constituting the semiconductor treatment apparatus. FIG. 3 is a plan view showing the devices, for clear understanding of the arrangement thereof.

A gas-phase decomposing device 101 comprises a cover 1 made of resin, a container 2 made of resin and capable of being sealed by the cover 1, a carrier table arranged in the container 2, and high-purity fluoride liquid 4 contained in the container 2. The cover 1 is coupled to the carrier table 3 and is vertically movable along with the carrier table 3. A carrier 5 for carrying the semiconductor substrate is placed on the carrier table 3.

A rotary treatment device 102 comprises a substrate supporting device (e. g., a vacuum chuck) 6, a liquid-drop applicator 8 and a liquid-drop preserving or recovering device (e.g., a reservoir) 9. The liquid-drop applicator 8 has a circular shape, and is provided with a plurality of liquid-drop retainer sections 10 along its periphery. The liquid-drop recovering device 9 has a circular shape, and is provided with a plurality of recesses along its periphery. The positional relationship between the substrate supporting device 6 and the liquid-drop applicator 8 is determined such that the axis of each liquid-drop retainer sections 10 is aligned with the center of the substrate supporting device 6 or the center of a semiconductor substrate 12 supported on the substrate supporting device 6. The liquid-drop applicator 8 and liquid-drop recovering device 9 overlap each other.

The substrate transfer device 103, with its arm 13 being extended or retracted, transfers the semiconductor substrate between the gas-phase decomposing device 101 and the rotary treatment device 102, that is, between the carrier 5 and the substrate supporting device 6.

The devices 101 to 103 are installed in an apparatus (e.g., a glove box, clean booth, etc.) 15 for producing a clean space, and are isolated from the outerspace. The devices 101 to 103 can be operated in a remote control mode, since the control device 104 drives a control motor, etc., to establish the operation timings of the devices 101 to 103.

Figure 5:
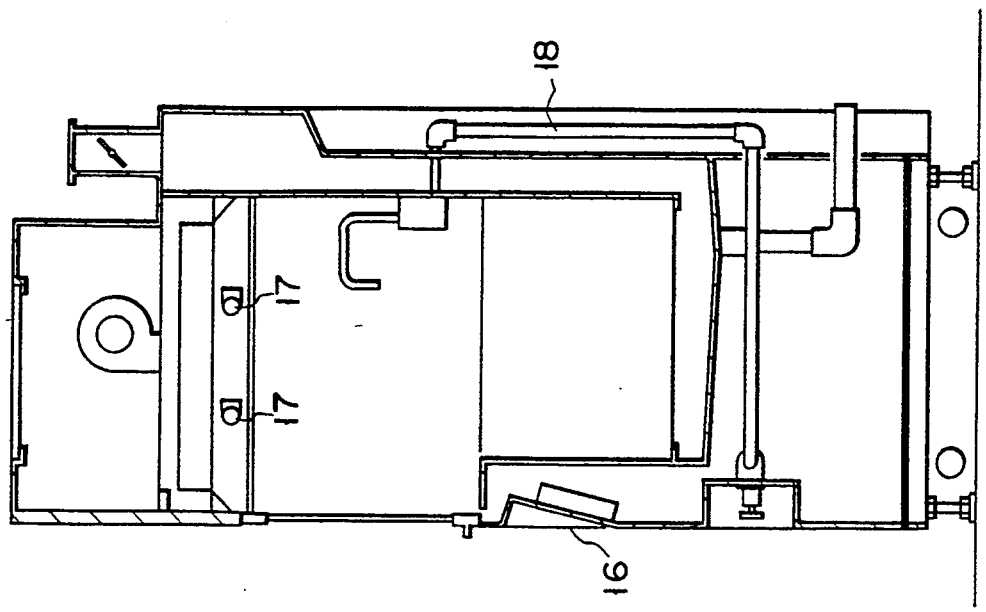
FIG. 5 is a cross-sectional side view of the clean booth.
Figure 4:
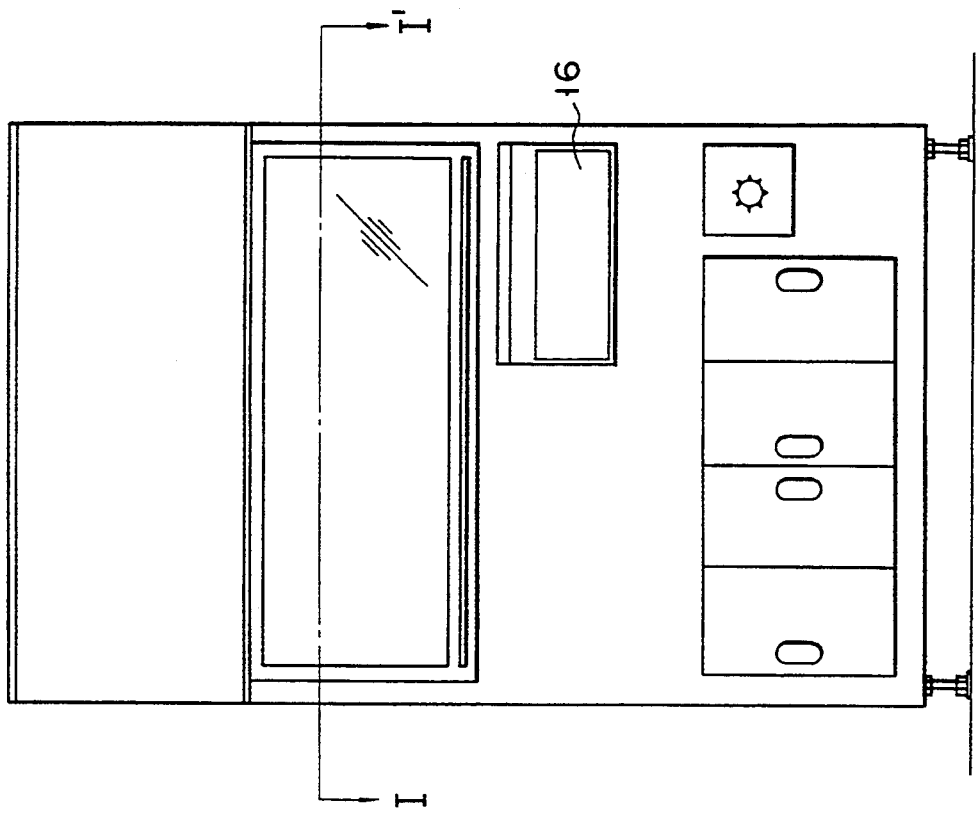
FIG. 4 is a front view of a clean booth.
Figure 6:
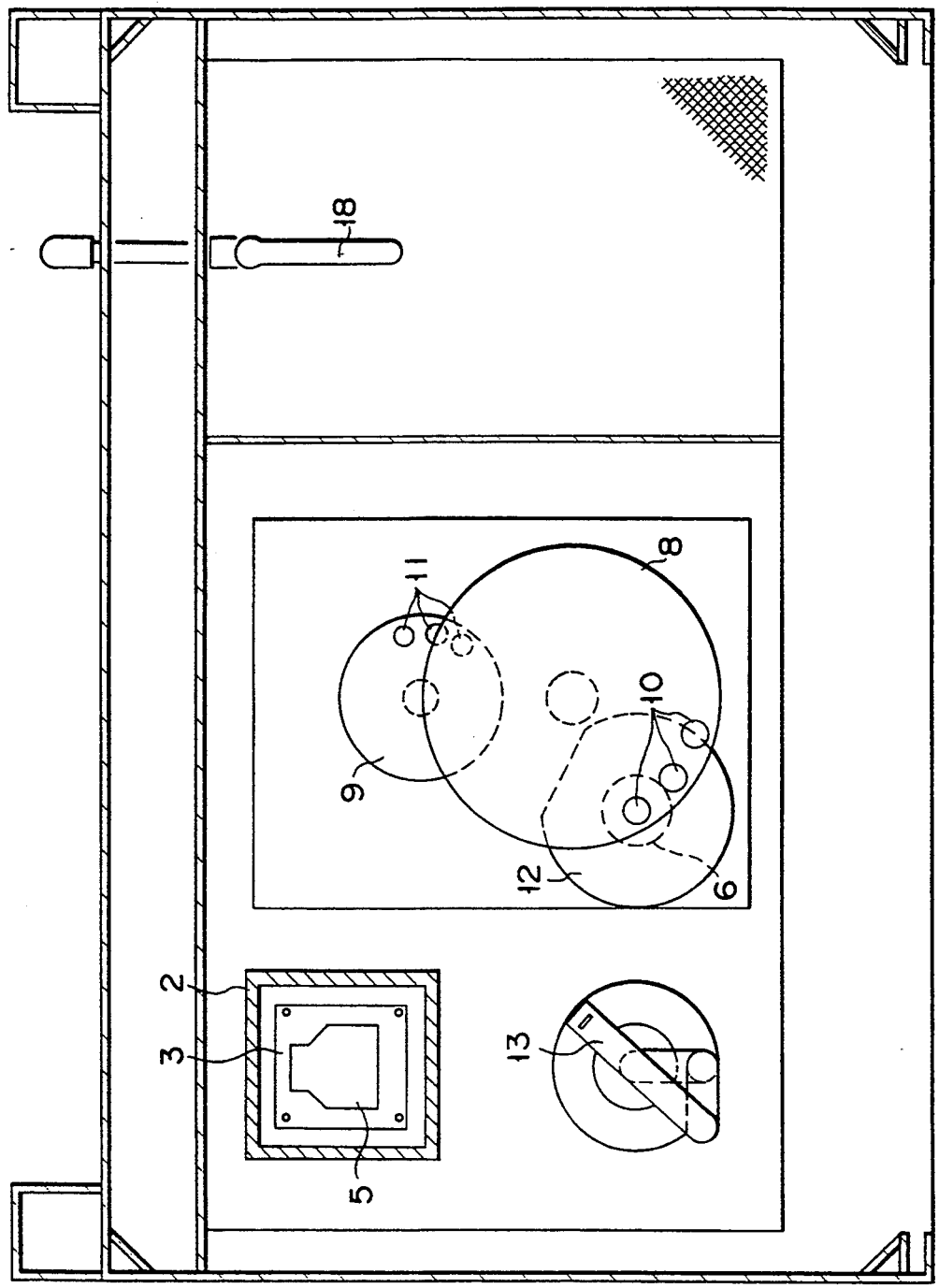
FIG. 6 is a cross-sectional view taken along line I—I in FIG. 4.
Figure 7A:
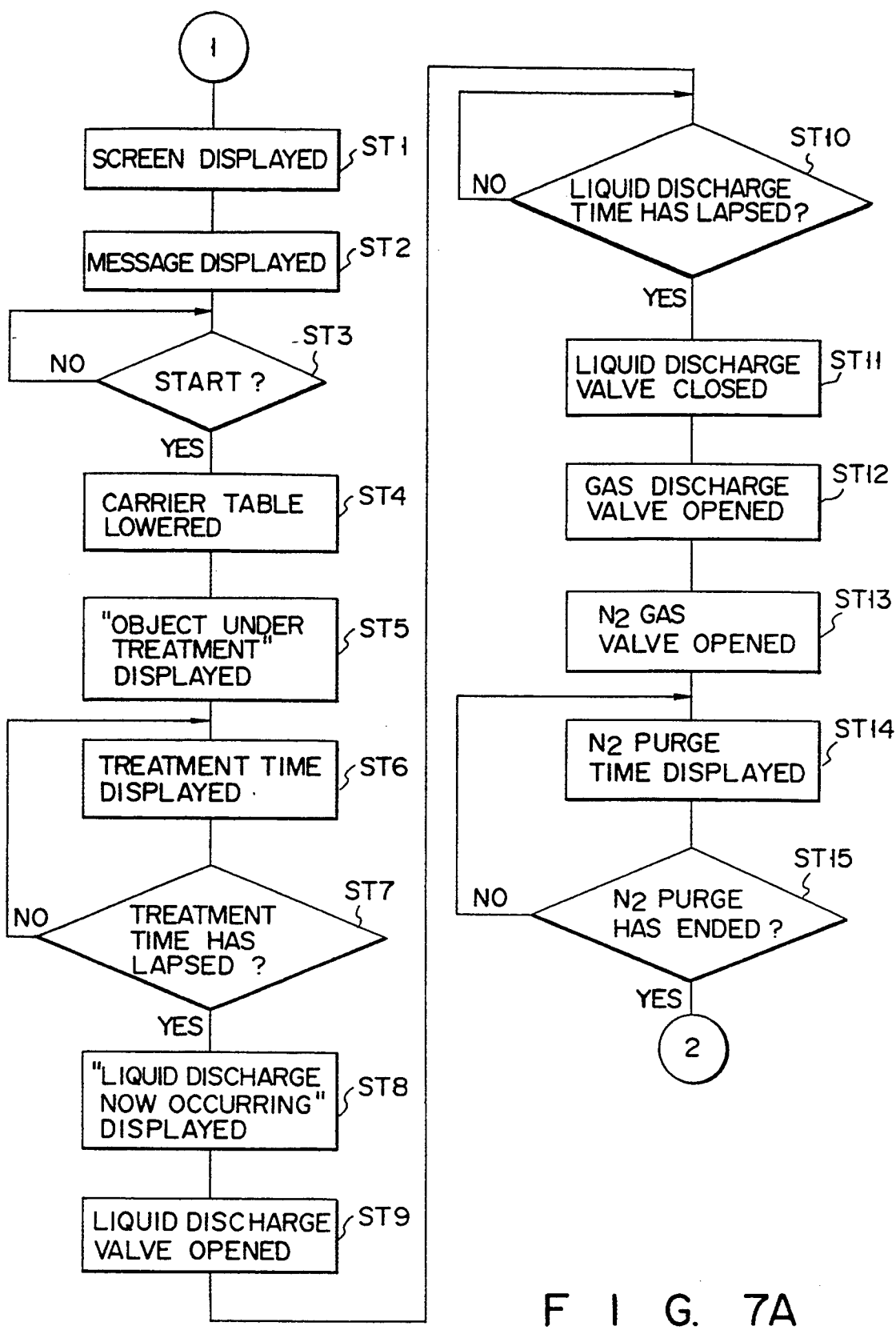
FIGS. 7A, 7B, 7C and 7D are flowcharts for illustrating the operation of a control apparatus according to the first embodiment of the present invention.
Figure 7B:
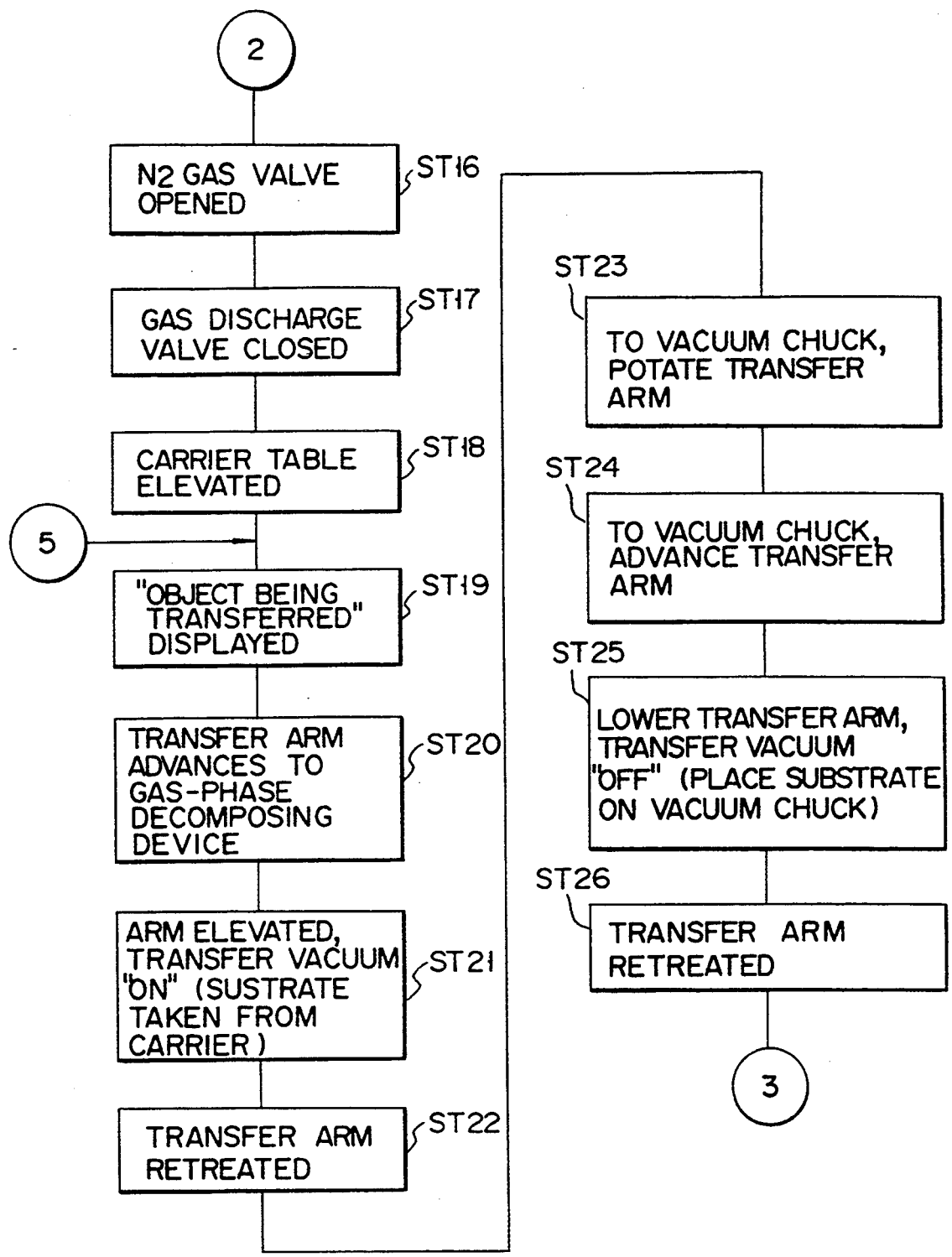
Figure 7C:
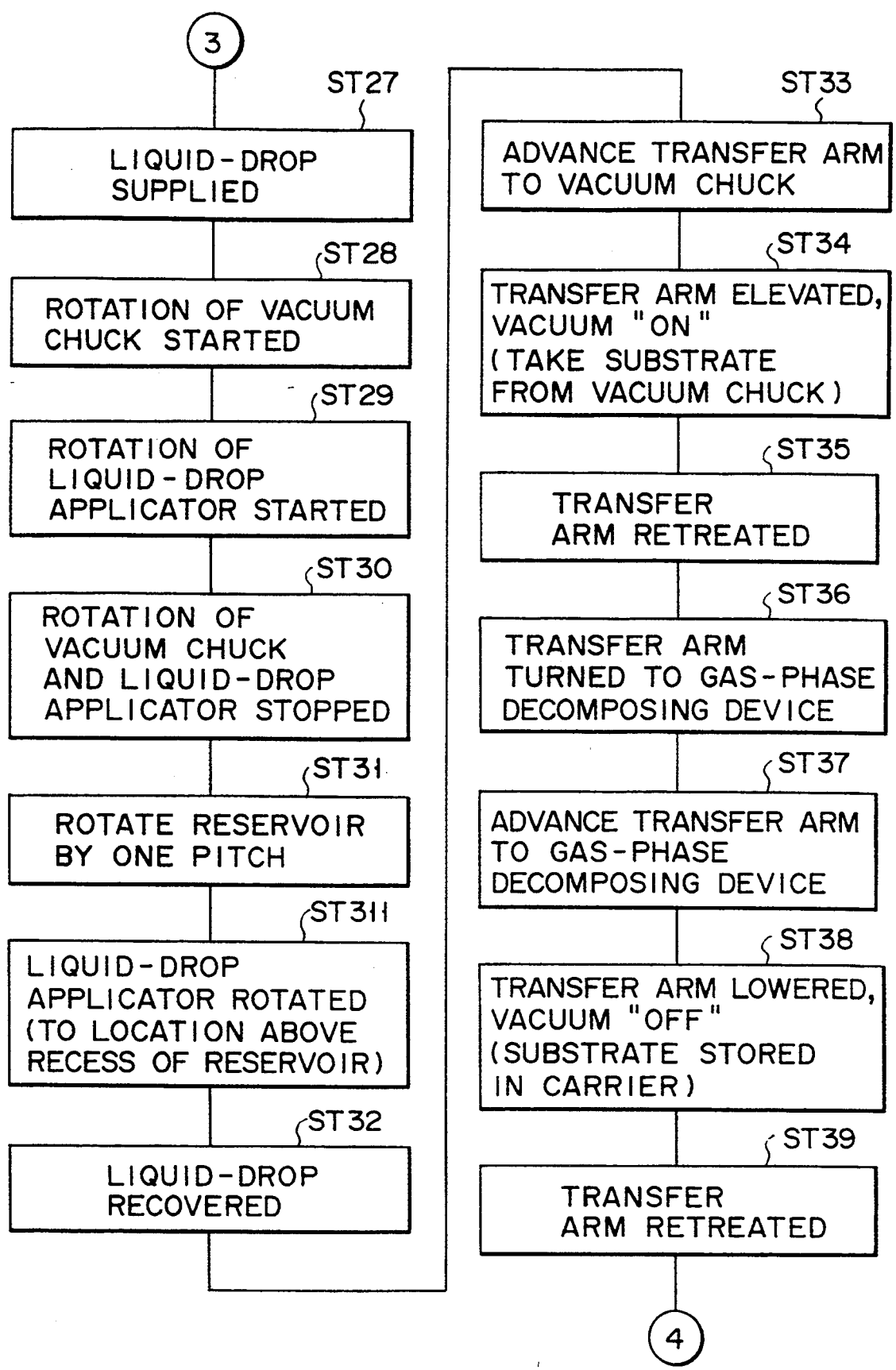
Figure 7D:
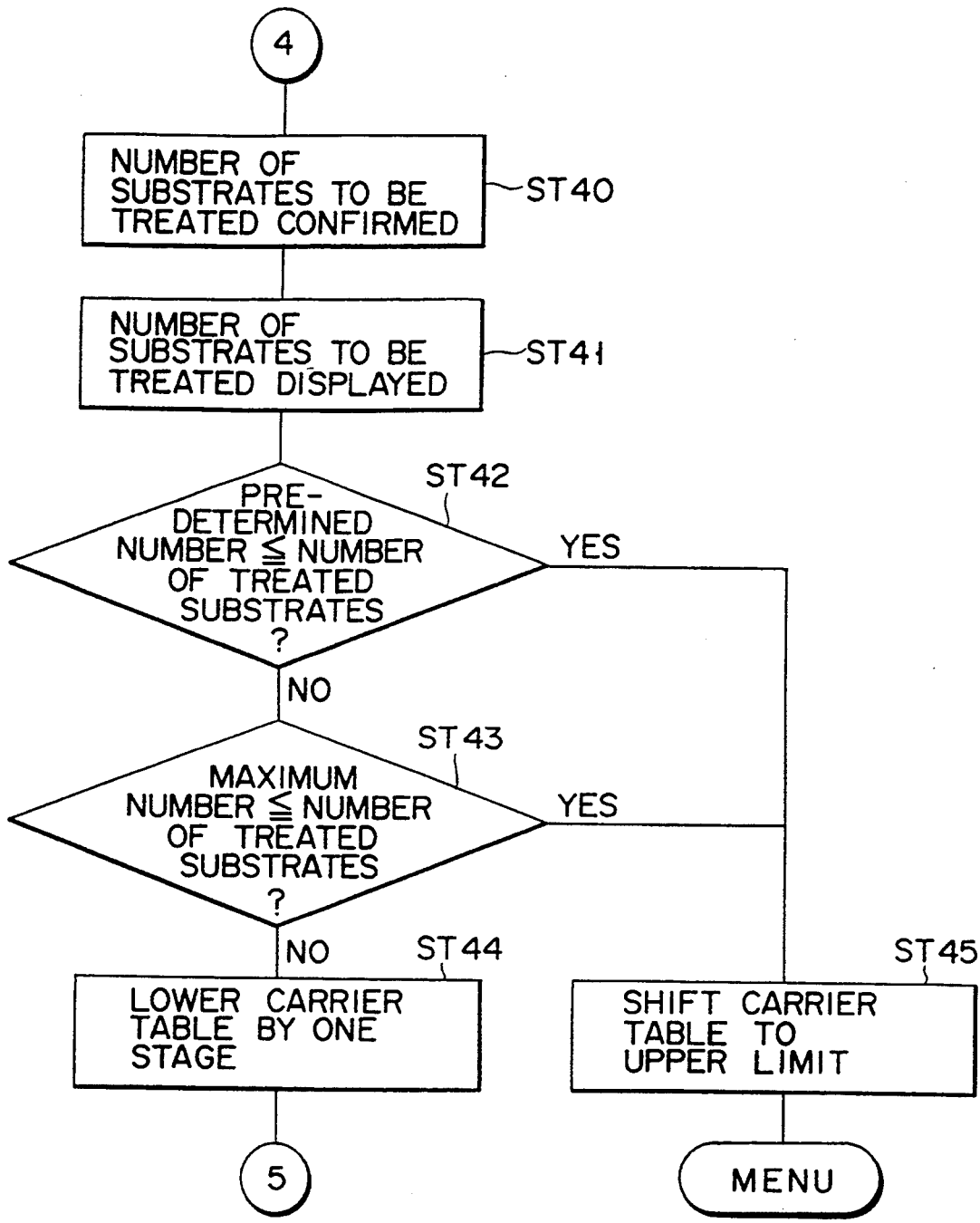

FIGS. 4 to 6 show a clean booth in detail, as the apparatus 15 for producing a clean space. FIG. 4 is a front view of the clean booth, FIG. 5 is a cross-sectional side view of the clean booth, and FIG. 6 is a cross-sectional view taken along line I—I' in FIG. 4. Reference numeral 16 denotes a display, numeral 17 illumination devices, and numeral 18 a pipe for supplying pure water.

FIGS. 7A to 7D are flowcharts for illustrating the operation of the control device 104. Hereinafter, the operation of the semiconductor treatment apparatus of the first embodiment will now be described in detail with reference to FIGS. 7A to 7D and FIGS. 2 and 3.

The devices 101 to 103 are arranged at predetermined locations in the apparatus 15 for producing a clean space. The high-purity fluoride liquid (e.g., hydrofluoric acid) 4 is introduced in the container 2, after the carrier table 3 has been elevated. The carrier 5 in which semiconductor substrates are set is arranged on the carrier table 3. Then, the carrier table 3 is lowered, and the container 2 is sealed by the cover 1 coupled to the carrier table 3 (Steps ST1 to ST4). The high-purity fluoride liquid 4 is evaporated and filled in the sealed container 2. Thus, an oxide film over the surface of a semiconductor substrate set on the carrier 5 is dissolved. As a result, liquid-drops containing impurities are formed on the surface of the substrate. (Steps ST5 to ST7). After the substrate is left for a predetermined time period, the fluoride solution 4 is discharged (Steps STB to ST11). Then, a high-purity inert gas (e.g., N2 gas) is caused to flow into the container 2. At this time, a difference in pressure between the inside of container 2 and the outside occurs, and the vapor of high-purity fluoride solution 4 is discharged to the outside of container 2 (Steps ST12 to ST17). Thereafter, the carrier table 3 is elevated (Steps ST18). In cooperation with the elevation of the carrier table 3, the arm 13 of substrate transfer device 103 takes out one of the semi-conductor substrates from the carrier 5 and sets it on the substrate supporting device (e.g., vacuum chuck) 6. The substrate supporting device 6 is made of a chemically inactive material such as fluorine-based resin (Steps ST19 to ST26). A liquid-drop 14 of fluoride solution (e.g., high-purity 1% HF (hydrofluoric acid) solution) is fallen in that one of, e.g., 25 liquid-drop retainer sections 10 of the liquid-drop applicator 8, which is located above the center of the substrate 12. The liquid-drop 14 is retained by the liquid-drop retainer 10 by virtue of surface tension. The liquid-drop applicator 8, like the substrate supporting device 6, is made of fluorine-based resin (Step ST27). The substrate supporting device 6 and the liquid-drop applicator 8 are rotated in a cooperating manner, and the liquid-drop 14 retained by the retainer 10 is caused to apply to the entire surface of semiconductor substrate 12 spirally from the center to the periphery thereof. Thus, the dissolved oxide film on the surface of semiconductor substrate 12, as well as the impurities contained in the dissolved oxide film, is absorbed in the liquid-drop 14. The rotation speed of the substrate supporting device 6 and liquid-drop applicator 8 is controlled so that the speed of applying the liquid-drop 14 can be kept constant (Steps ST28 to ST29). After the liquid-drop 14 has been completely applied to the surface of semiconductor substrate 1 the liquid-drop 14 is moved away from the substrate 12 and is recovered by the liquid-drop recovering device 9. In the same manner as the liquid-drop 14 is applied to the surface of substrate 12, the liquid-drop 14 is applied to the surface of recovering device 9. When the liquid-drop 14 is brought into contact with one of, e.g., 25 recesses 11 of the recovering device 9, the rotation of the substrate supporting device 6 and the liquid-drop applicator 8 is stopped and the recovering device 9 is rotated by the pitch of recess 11. Then, the liquid-drop 14 falls into the recess 11 by the gravity and surface tension (Steps ST30 to ST32). Thereafter, the substrate transfer device 103 restores the substrate 12 to the carrier 5, and a series of operations have been completed (Steps ST33 to ST39). In this state, the positions of the substrate supporting device 6 and the liquid-drop recovering device 9 are determined such that the liquid-drop retainer 10, which has not yet been used for the recovery of liquid-drop, is situated at the center of the supporting device 6. Similar operations are carded out to treat a single lot of substrates (Steps ST40 to ST45).

As has been described above, the substrate 12 is taken out of the carrier 5, the impurities on the substrate are recovered, and the substrate 12 is restored to the carrier 5. These operations are repeated, and samples of all substrates can be recovered. Impurity analysis of the recovered sample is conducted by using an analyzer, for example, a frameless atom light-absorption type spectral analyzer.

Figure 8:
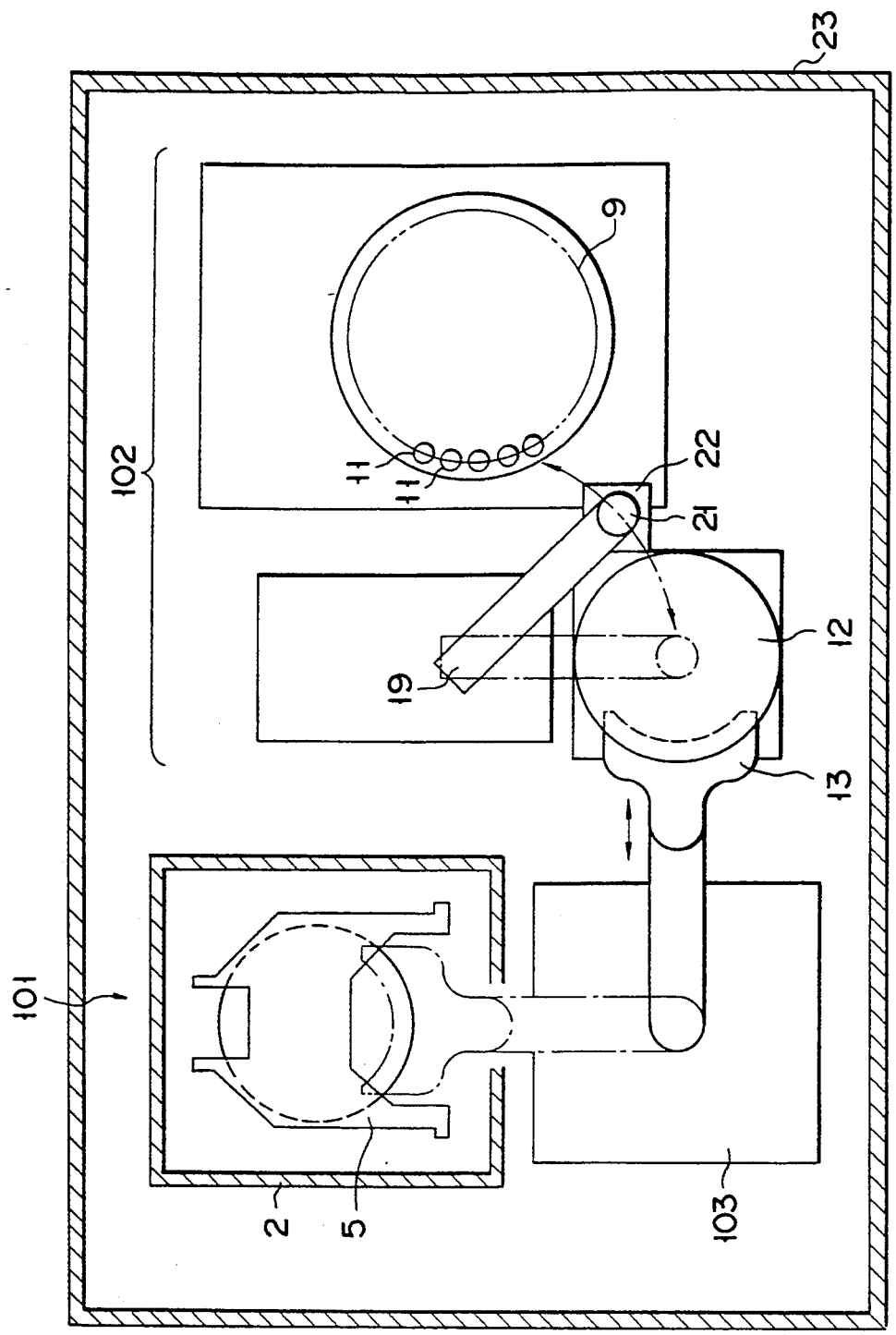
FIG. 8 is a plan view of a semiconductor treatment apparatus according to a second embodiment of the present embodiment.
Figure 9:
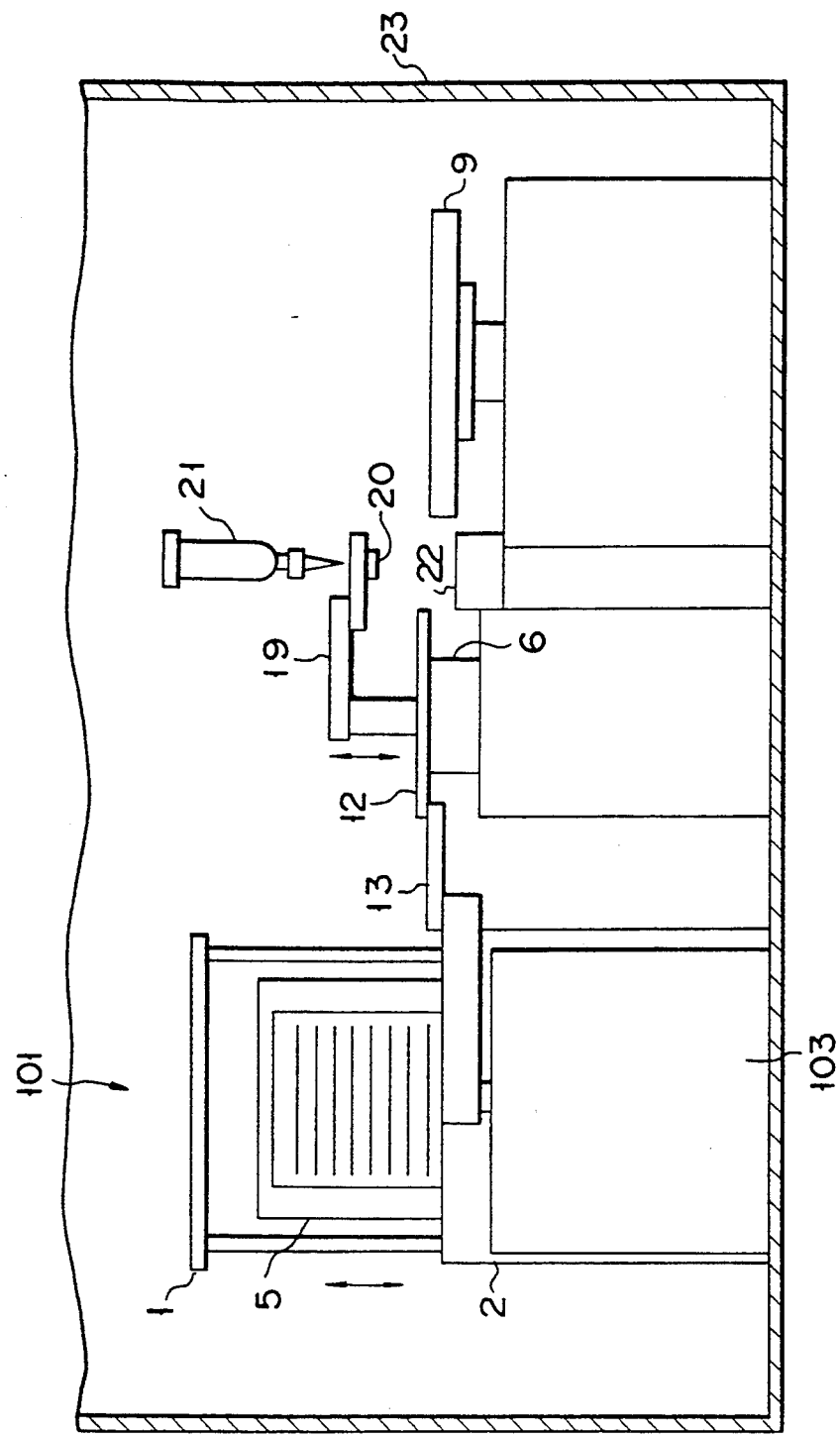
FIG. 9 is a side view of the semiconductor treatment apparatus according to the second embodiment.

FIGS. 8 to 10 show a second embodiment of the semi-conductor treatment apparatus according to the present invention, wherein the apparatus shown in FIGS. 2 to 6 has been partially improved.

According to the second embodiment, like in the first embodiment, a carrier table (not shown) is arranged in a resin-made container 2 which can be sealed by a resin-made cover 1. A carrier 5 for carrying semi-conductor substrates is disposed on the carrier table. A high-purity fluoride solution is put in the container 2. When the cover 1 is closed, vapor of the high-purity fluoride is filled in the container, and a reaction product is formed by the reaction between the fluoride and an oxide film on the surface of the semiconductor substrate. Also, there is provided a substrate transfer device 103 for transferring the semiconductor substrate between the carrier 5 and a substrate supporting device (e.g., a vacuum chuck) 6.

The semiconductor treatment apparatus shown in FIGS. 8 to 10 has a liquid-drop applicator 19 with a rotational shaft. The applying device 19 can suck and support a liquid-drop retainer 20 formed of fluorine resin (e.g., PTFE). The rotational axis of the applying device 19 is positioned such that the liquid-drop retained by the liquid-drop retainer 20 is aligned with above the center of substrate 12, i.e., the center of the substrate supporting device 6. A dispenser 21 for supplying a liquid drop of, e.g., fluoride solution to the liquid-drop retainer 20 is provided above the retainer 20 supported by the liquid-drop applicator 19. In order to keep the liquid-drop that has been applied to the surface of the substrate 12, there is provided a circular liquid-drop recovering device (e.g., a reservoir) 9 having a plurality of recesses 11 along its periphery. Also, a recovering box 22 for recovering the liquid-drop retainer 20 is installed. The devices 101 to 103 are housed in a clean booth 23, and isolated from the outside space. The remote control of devices 101 to 103 can be performed, by enabling a control device to drive a control motor or the like to establish the operational timings of the devices 101 to 103.

Figure 11B:
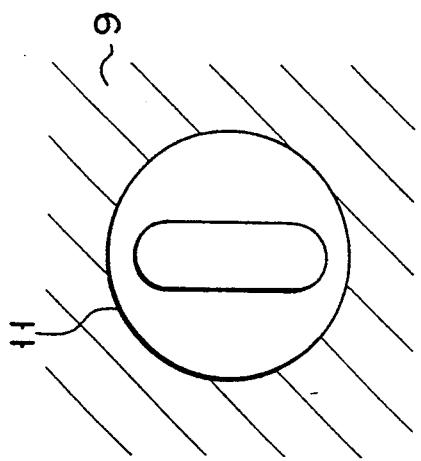
FIG. 11B is a plan view of the apparatus shown in FIG. 11A.
Figure 11A:
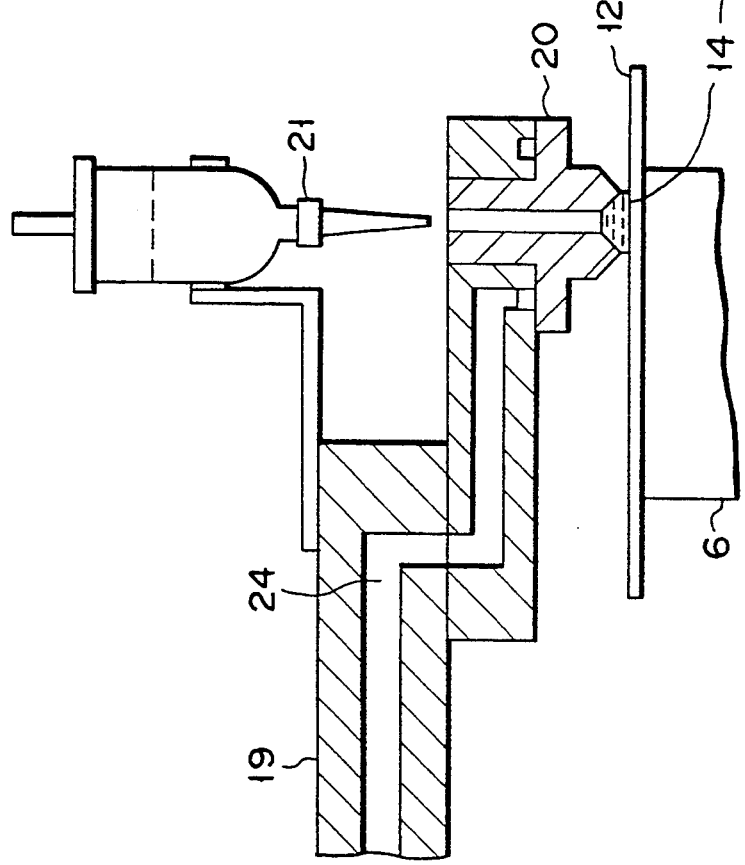
FIG. 11A is a cross-sectional-view of important portions of the semiconductor treatment apparatus shown in FIGS. 8 and 9.
Figure 12A:
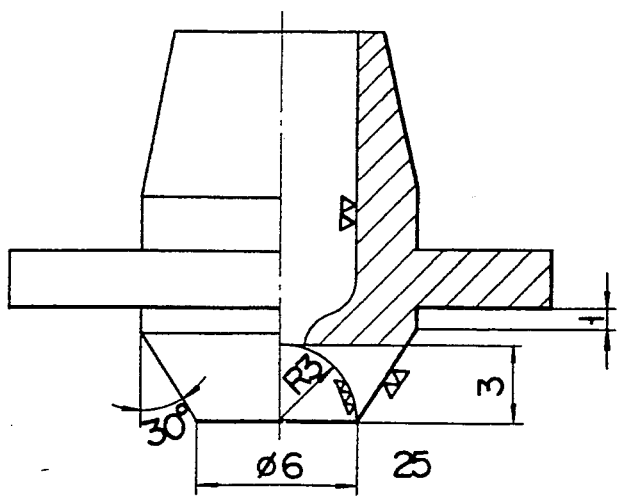
FIGS. 12A and 12B show in detail a liquid-drop retainer of the semiconductor treatment apparatus shown in FIGS. 8 and 9.
Figure 12B:
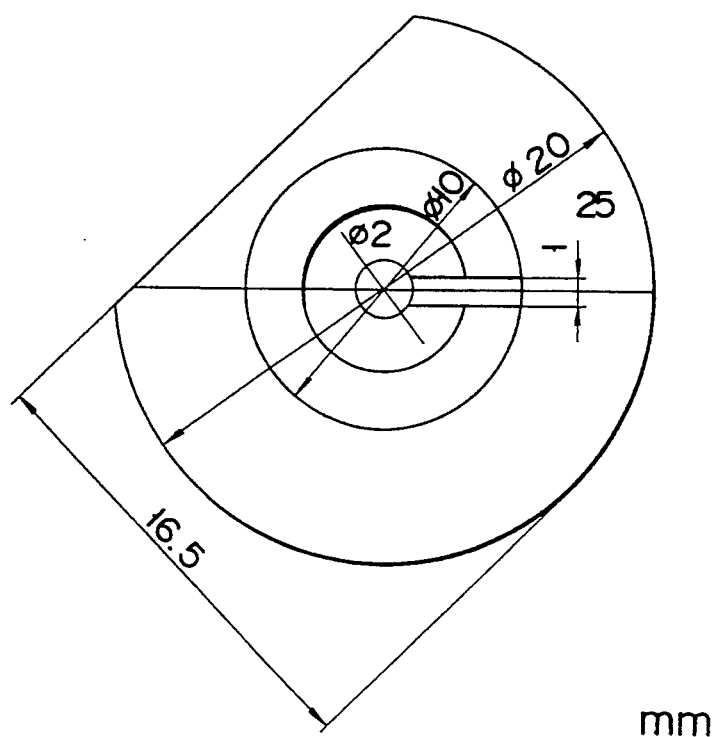
Figure 13A:
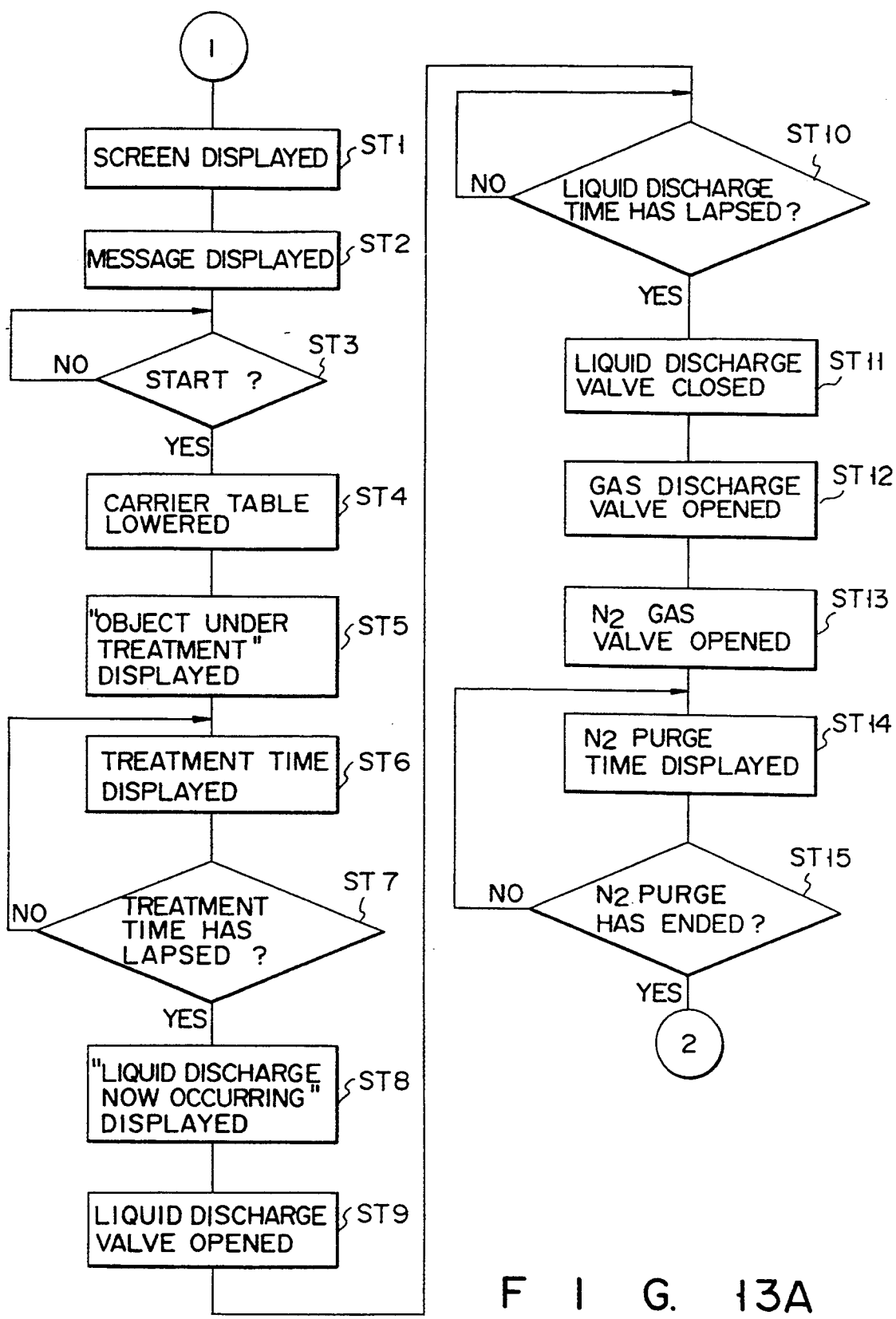
FIGS. 13A to 13D and 13E are flowcharts for illustrating the operation of a control apparatus according to the second embodiment.
Figure 13B:
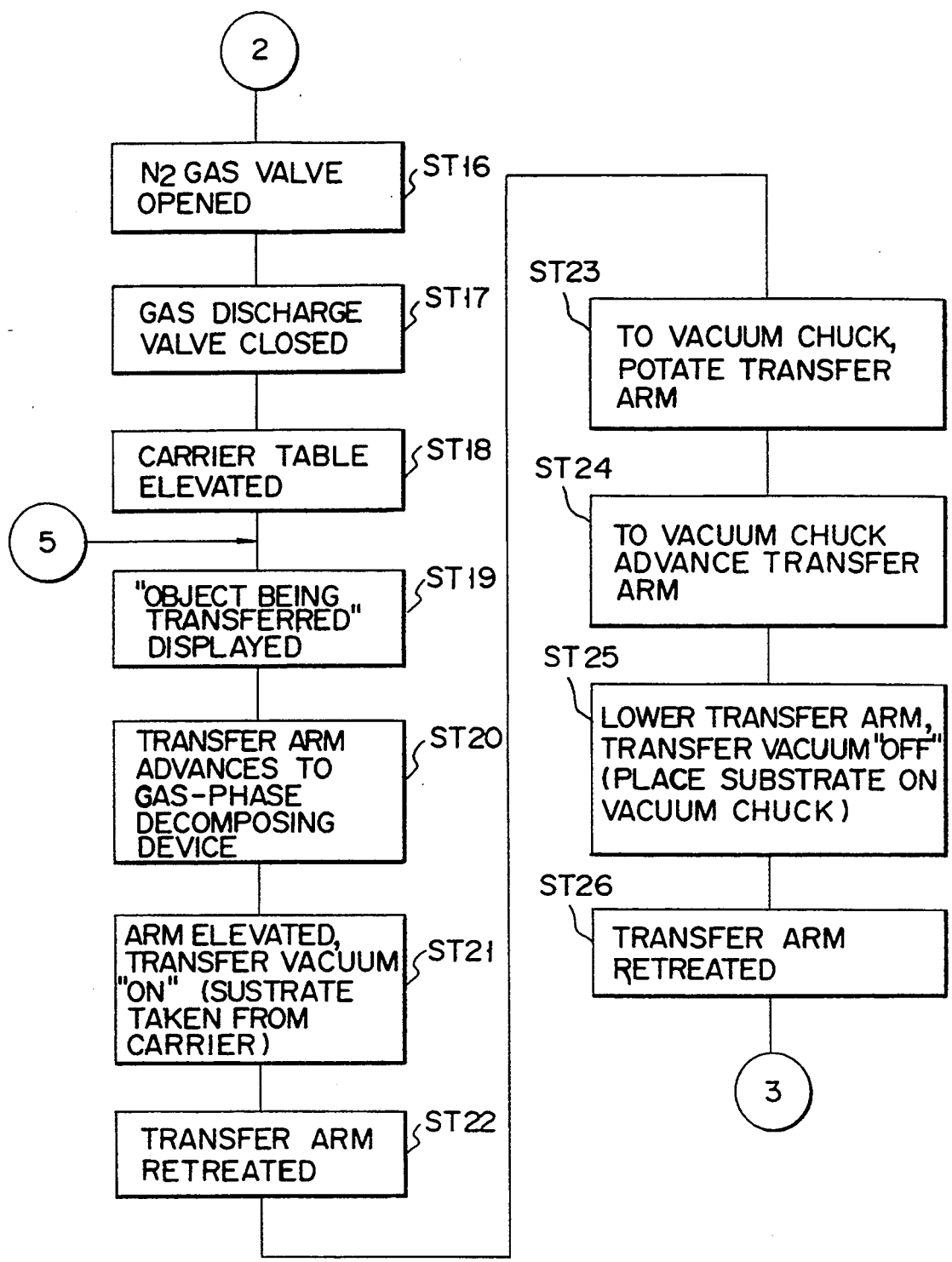
Figure 13C:
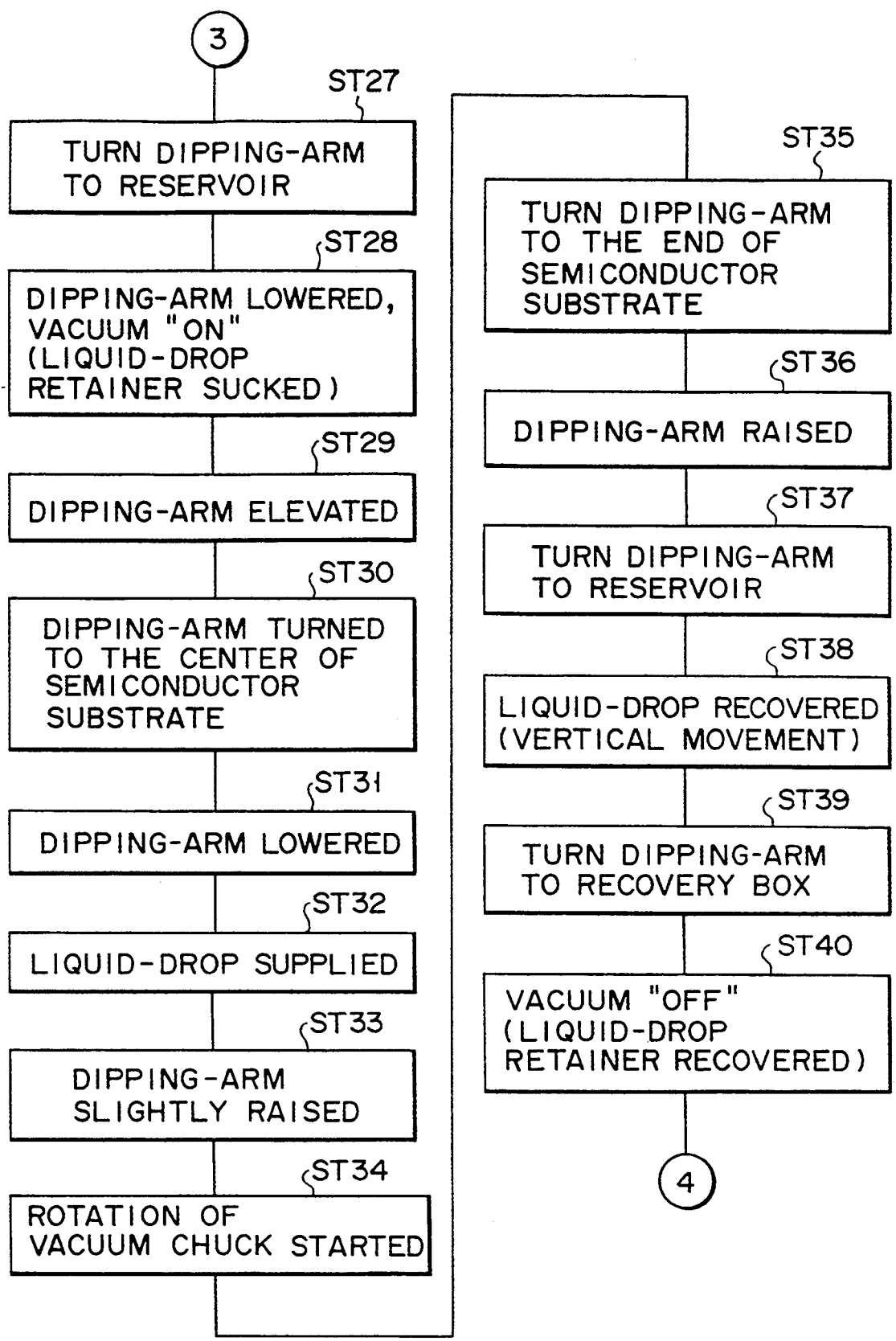
Figure 13D:
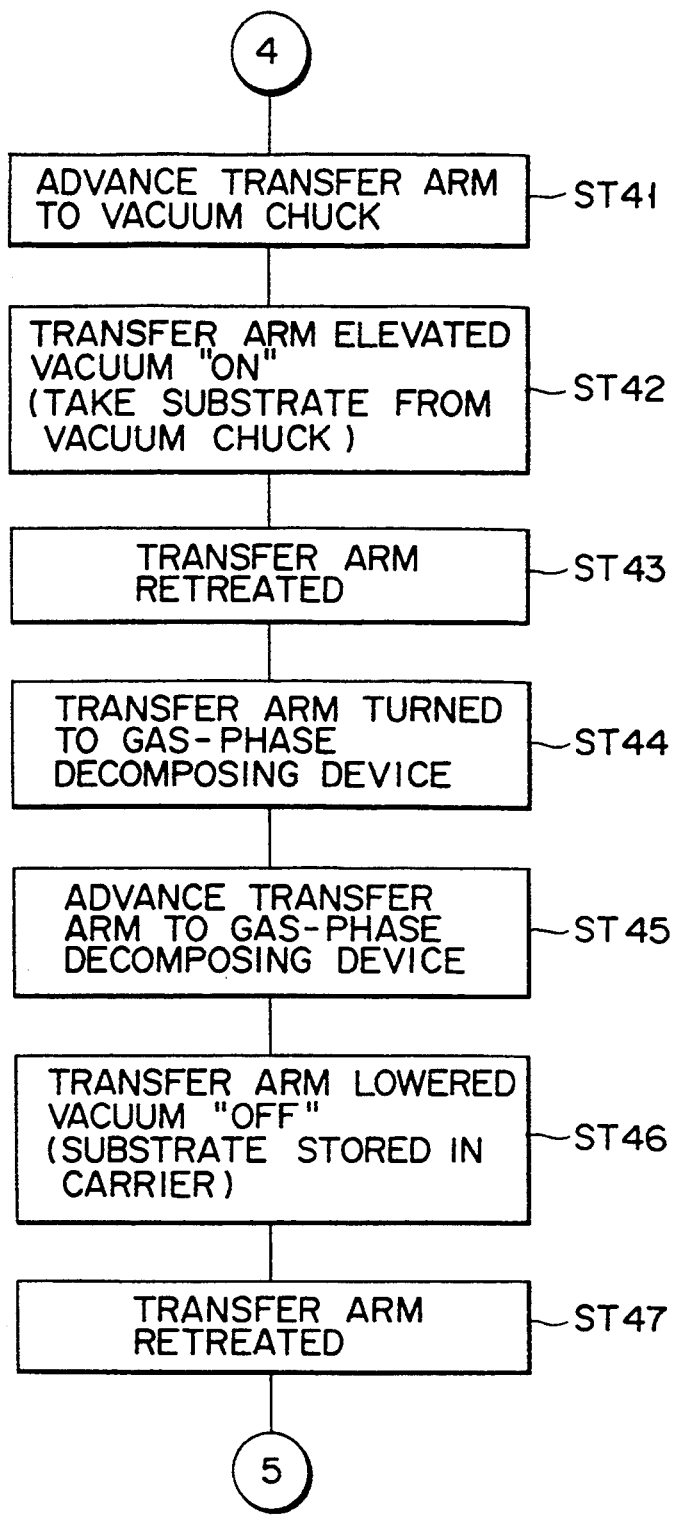
Figure 13E:
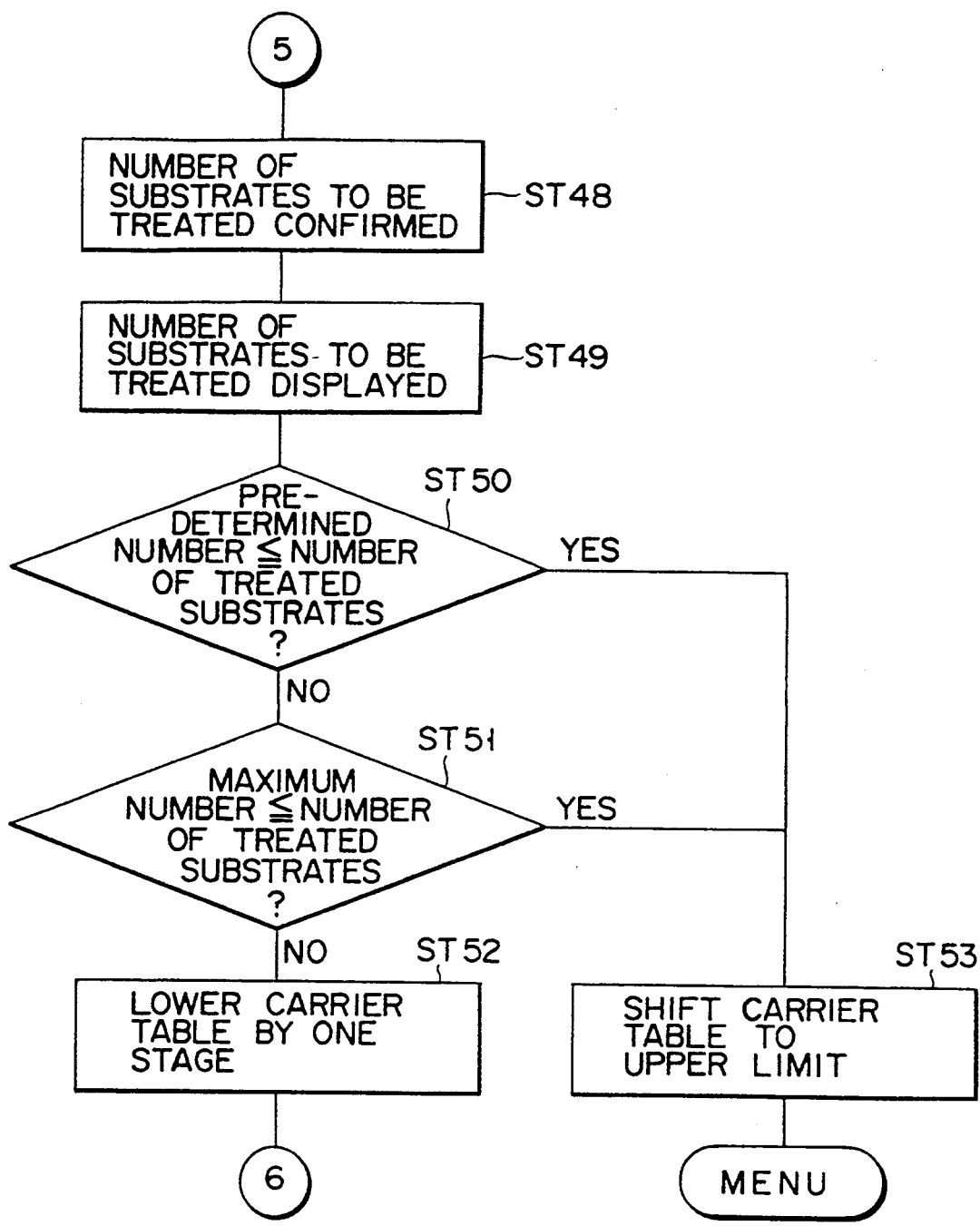

FIGS. 11A and 11B show in detail the liquid-drop recovering device 9 and liquid-drop applicator 19 shown in FIGS. 8 to 10. FIGS. 12A and 12B show the liquid drop retainer 20 in detail.

In the initial state, the liquid-drop retainers 20, which have not yet been used, are set in the recesses 11 formed along the periphery of the liquid-drop recovering device 9. The liquid-drop applicator 19 for sucking and supporting the retainer 20 has a suction pipe 24. The suction pipe 24 is connected, for example, to a pump, and can suck the liquid-drop retainer 20 by virtue of negative pressure. FIGS. 13A to 13E are flowcharts illustrating the operation of the control device. The operation of the semiconductor treatment apparatus of the second embodiment will now be described with reference to FIGS. 13A to 13E and FIGS. 8 to 12.

The semiconductor substrate 12 is set on the substrate supporting device 6 by the same operations as in the first embodiment (Steps ST1 to ST26). Then, the liquid-drop applicator 19 sucks and supports, by virtue of vacuum, one of the liquid-drop retainers 20 set in the recesses 11 of the liquid-drop recovering device 9 (Steps ST27 and ST28). After the liquid-drop retainer 20 is shifted to the center of the substrate 12 (Steps ST29 to ST31), the dispenser 21 drops a liquid-drop 14 of fluoride solution (e.g., high-purity 1% (hydrofluoric acid) solution) into the retainer 20 (Steps ST32 and ST33). In accordance with the rotation of substrate 12, the liquid-drop applicator 19 rotates such that the liquid-drop 14 retained by the retainer 20 slides over the surface of substrate 13 from the center to the periphery of substrate 12. The rotation speed of the substrate supporting device 6 and liquid-drop applicator 19 are controlled by a computer program, so that the speed of applying the liquid-drop 14 to the surface of substrate 12 can be kept constant (Steps ST34 to ST35). When the liquid-drop 14 reaches the periphery of substrate 12, the liquid-drop 14, while being retained by the retainer 20, is shifted to the position above the recess 11 in which the retainer 20 was previously set (Steps ST36 and ST37). The retainer 20 retaining the liquid-drop 14 is placed in the recess 11, and the bottom face of liquid-drop 14 is brought into contact with the bottom of recess 11. The liquid-drop 14 wets the bottom face of recess 11 until the contact angle between the drop 14 and the bottom face of recess 11 becomes equal to an advancing contact angle. In other words, if the bottom face of recess 11 is formed in a circular shape, for example, as shown in FIG. 11, the drop 14 spreads over the entire bottom face of recess 11. Consequently, the liquid-drop 14 is narrowed at its middle part, by virtue of a high tensile stress acting between the retainer 20 and the drop 14. Then, the drop 14 begins to be separated from the inner wall of retainer 20 by the function of a groove 25 formed in the retainer 20 (see FIGS. 12A and 12B). Once the separation of the liquid-drop 14 begins, the separation is continued by the weight of the drop 14 itself. Finally, the entire liquid-drop 14 falls in the recess 11, and the recovery of the drop 14 is completed (Step ST38). After the recovery of the liquid-drop 14, the liquid-drop retainer 20 is shifted to the position of the recovery box 22, and is recovered in the recovery box 22 (Steps ST39 to ST40). The substrate 12, which has been treated, is restored into the carrier 5 by the substrate transfer device 103 (Steps ST41 to ST47). Thus, the series of operations have been performed to obtain the analysis samples of a single lot of substrates, and impurities on the surface of substrates have been recovered (Steps ST48 to ST53).

In the first and second embodiments described above, the liquid-drop recovering device 9 can be made 25 an optically flat plate, such as a silicon wafer, a pure metal plate or a glass plate, and a mechanism supporting the plate. If this is the case, a liquid drop 14 is collected at a given point or given points on the optically flat plate. The liquid drop, thus collected, is evaporated by a drying device which comprises, for example, a lamp. Then, the impurities can be easily analyzed by means of spectroscopy, for example, total-reflection X-ray fluorescence spectroscopy. To enhance the efficiency of the impurity analysis, it is desirable that the plate has a surface which defines a contact angle of 900 with a liquid drop 14.

FIG. 14 is a block diagram showing the basic structure of a semiconductor treatment apparatus according to a third embodiment of the invention, which is a modification of the second embodiment.

The apparatus shown in FIG. 14 has improved means for a re-collecting liquid drop. This apparatus requires no liquid-drop preserving devices, and comprises an evaporation device 105 and a substrate storing device 106. With reference to FIGS. 14 to 16B, the operation of this apparatus will be explained in detail.

Figure 15:
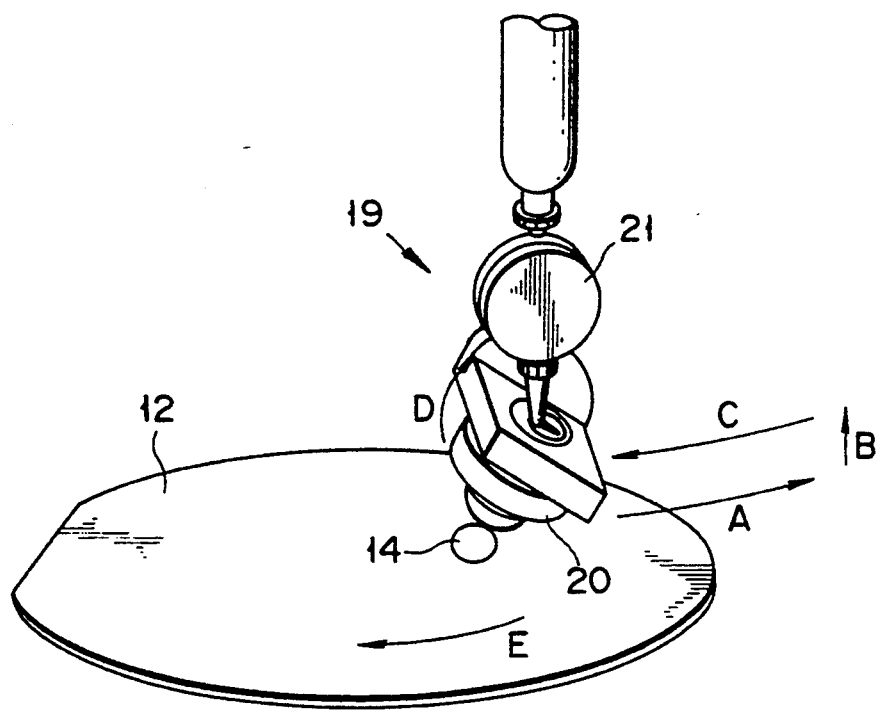
FIG. 15 is an external view of a semiconductor treatment apparatus according to a third embodiment of the present invention.
Figure 16A:
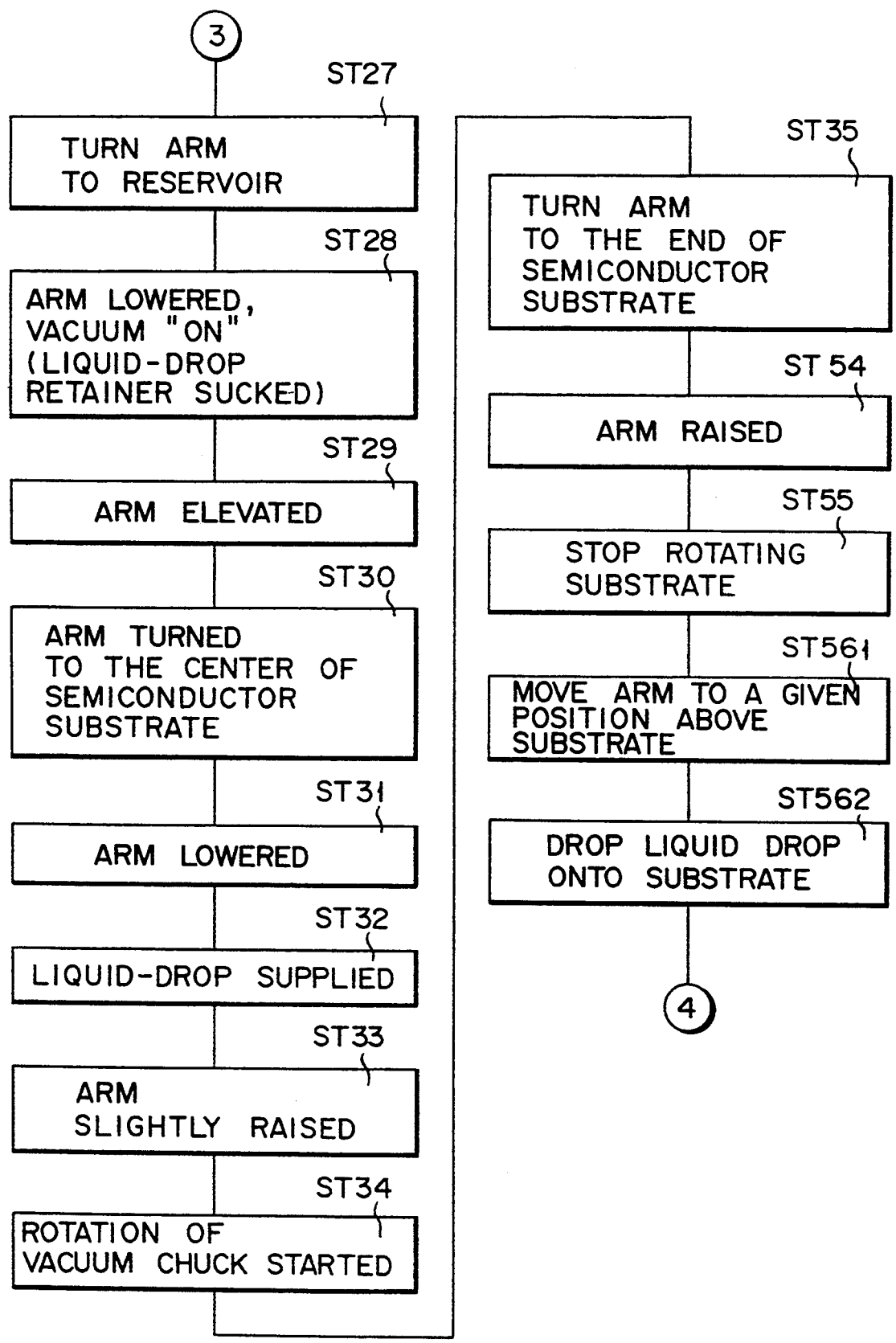
FIGS. 16A and 16B are flowcharts for illustrating the operation of a control apparatus according to the third embodiment of the present invention.
Figure 16B:
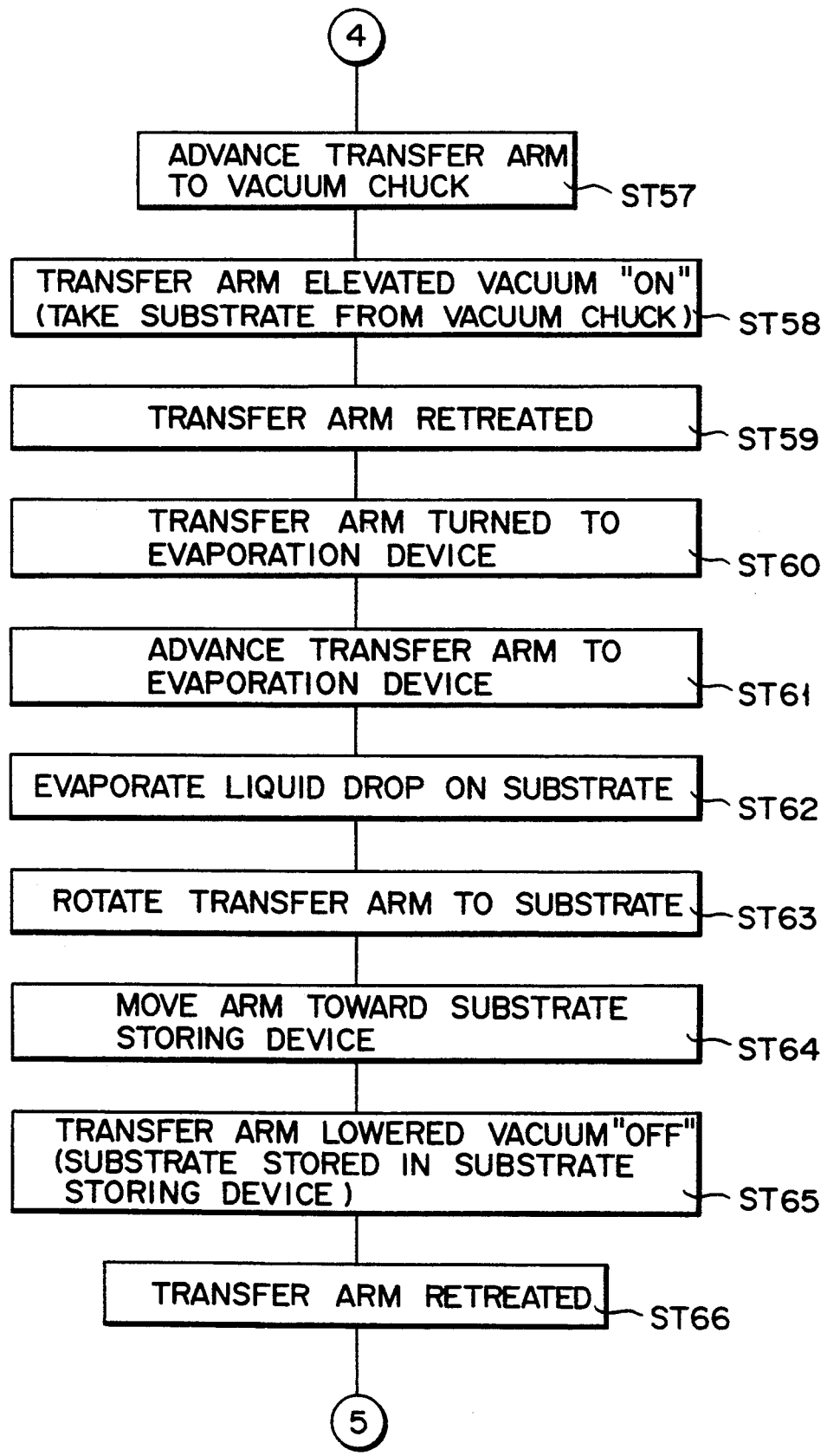

First, the impurities on a semiconductor substrate 12 are collected into a liquid drop 14, under the control of a control device 104, in the same way as in the second embodiment (Steps ST1 to ST35). A liquid-drop applicator 19 moves the liquid drop 14 to the periphery of the substrate 12 and further from the substrate 12, in the direction of arrow A shown in FIG. 15. Then, the substrate 12 is stopped (Step ST55). Next, as is shown in FIG. 15, the applicator 19 is moved upward in the direction of arrow B, and then moved back to the substrate 12 in the direction of arrow C. While the applicator 19 is moving in the directions of arrow A, B, and C, the retainer 20 keeps holding the liquid drop 14. Then, the substrate 12 is rotated in the direction of arrow E shown in FIG. 15. The substrate 12 is stopped the moment a given point on its surface reaches the liquid drop 14. Next, the retainer 20 is rotated in the direction of arrow D shown in FIG. 15 and FIG. 18, whereby the grooves 25 (see FIG. 12B) of the retainer 20 moves upwards away from the substrate 12. As a result, the liquid drop 14 is left at the given point on the surface of the substrate 12 (Step ST56).

Thereafter, a substrate transfer device 103 transfers the substrate 12 to the evaporation device 105 (steps ST57 to ST61). In the device 105, the liquid drop 14 is evaporated (Step ST62). Further, the substrate transfer device 103 transfers the substrate 12 to the substrate storing device 106 (Steps ST63 to ST64), thereby storing the substrate 12 into the substrate storing device 106. Thereafter, the sequence of the same steps as described above is repeatedly performed for the remaining substrates 12 of the same lot. After all substrates 12 of the same lot have been stored in the device 106, they subjected to total-reflection X-ray fluorescence spectroscopy, whereby the surface of each substrate 12 is analyzed with high accuracy.

Figure 17:
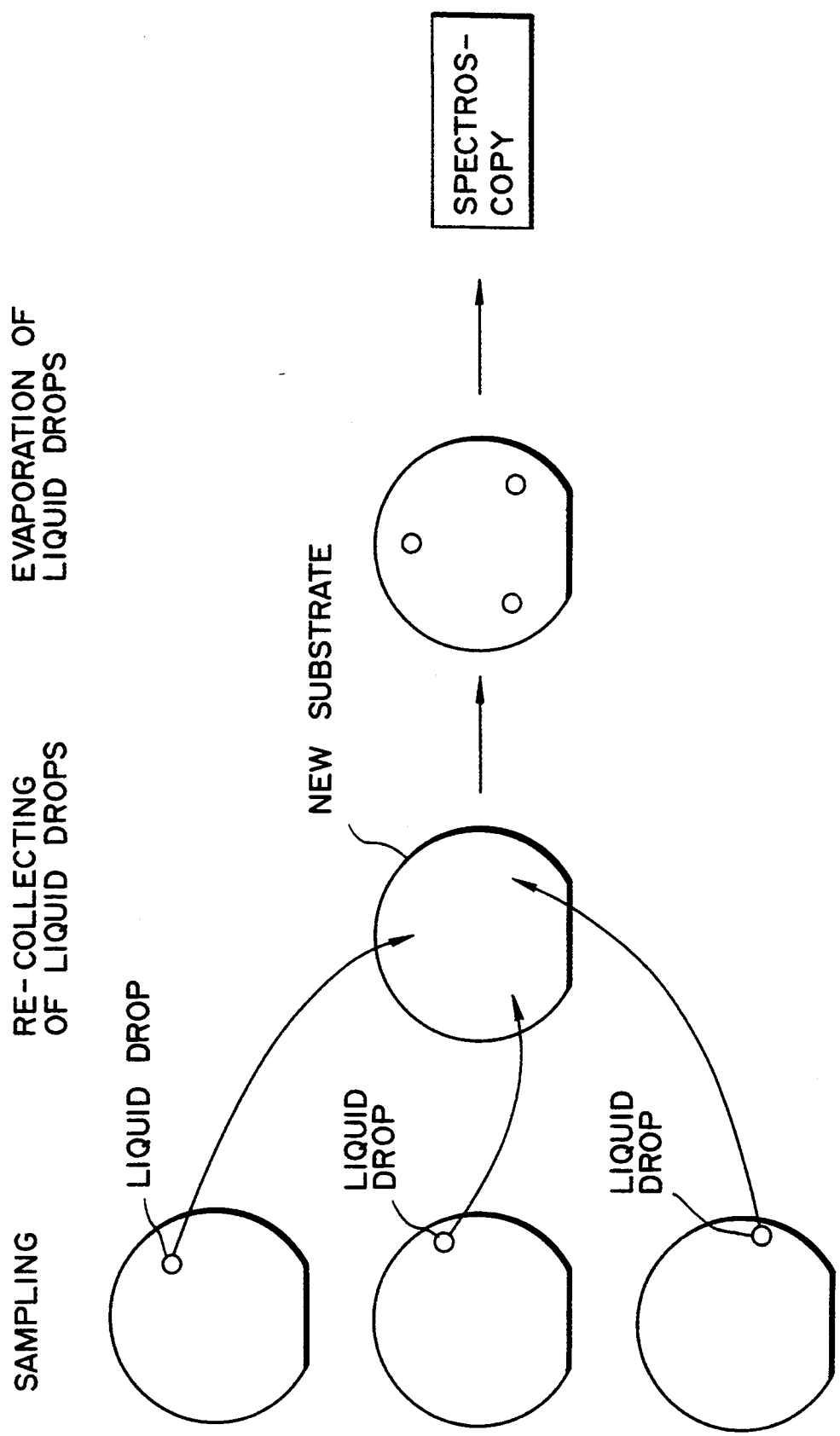
FIG. 17 is a diagram explaining a method of recollecting the impurities.

In the third embodiment, a liquid 14 drop is removed to the substrate 12 and then collected. Instead of the substrate 12, an optically flat plate, such as a silicon wafer, a pure metal plate or a glass plate, can be used to collect the liquid drop 14. Further, liquid drops can be dropped to only one point or a plurality of points on the surface of the substrate 12. Further, liquid drops can be collected from a plurality of substrates (i.e., samples) at only one point on the surface of a new substrate or, as is shown in FIG. 17, at points thereon, thereby to enhance the efficiency of collecting the liquid drops. Still further, the optically flat plate can have a surface which defines a contact angle of 900 with a liquid drop 14. Moreover, any substrate processed can be collected at the initial position in a carrier 5, though it would be most efficient to store the substrate 12 in the substrate storing device 106. A lamp used as heat source or a low pressure device is provided within the evaporation device 105.

According to the apparatus of the present invention, impurities on the surface of a semiconductor substrate can be recovered with use of a liquid-drop, without performing a thermal oxidation process that results in a pollution. Therefore, the apparatus according to the invention can detect impurities to $10^{11}$ atoms/cm$^2$, while the conventional apparatus can detect impurities, but only to $10^9$ atoms/cm$^2$. For example, the apparatus of the invention could detect aluminum with accuracy 101 times higher than the accuracy achieved by the first conventional method (i.e., the gas-phase decomposing method), and with accuracy 102 times higher than the accuracy attained by the second conventional method. Further, the apparatus can detect Na or Fe with accuracy higher than the accuracy achieved by the conventional methods. In addition, the sample liquid can automatically be recovered and analyzed by remote control, without touching the devices or substrate by the hand. Thus, compared to the conventional process, an impurity analysis can be conducted with shorter time, high precision and high reliability. Furthermore, safety is enhanced, since an operator does not directly handle a poisonous liquid such as fluoride solution. As a result, the number of staff members and the time required for impurity analysis can be reduced 50%.

In the first to third embodiments, the liquid-drop 14 used for recovering impurities was fluoride solution (e.g., high-purity 1% HF (hydrofluoric acid) solution). However, a water solution including an oxidizing agent, a water solution including a reducing agent, or a water solution including both the oxidizing agent and reducing agent. As such a water solution, there are hydrochloric acid, nitric acid, hydrogen peroxide, etc. In addition, in the embodiments, the amount of the liquid-drop was 100 μl. However, this amount can be varied by changing the shape of the liquid-drop retainer, the shape of the recess of the reservoir, and the discharge amount of the dispenser.

What is claimed is:

1. A semiconductor treatment apparatus for recovering impurities from a surface of a semiconductor substrate, comprising:
    gas-phase decomposing means for dissolving a surface of a semiconductor substrate by exposing the semiconductor substrate to a vapor;
    substrate supporting means for supporting the substrate;
    substrate transfer means for transferring the substrate between said gas-phase decomposing means and said substrate supporting means;
    liquid-drop applying means for sweeping the surface of the substrate by use of a liquid-drop when the substrate is supported by the substrate supporting means, such that said liquid-drop remains in contact with both the liquid-drop applying means and the substrate during sweeping, wherein said liquid-drop applying means includes at least one liquid-drop retainer section for retaining said liquid-drop;
    liquid-drop preserving means for preserving for subsequent impurity analysis the liquid-drop after it has been swept across the surface of said substrate; and
    a housing in which said gas-phase decomposing means, said substrate supporting means, said substrate transfer means, said liquid-drop applying means, and said liquid-drop preserving means are housed.

2. The apparatus according to claim 1, wherein said substrate supporting means is a vacuum chuck.

3. The apparatus according to claim 1, wherein said liquid-drop applying means is circular and has a plurality of liquid-drop retainer sections along a periphery thereof for retaining the liquid-drop by virtue of surface tension.

4. The apparatus according to claim 1, wherein said liquid-drop preserving means is circular and has a plurality of recesses along a periphery thereof.

5. The apparatus according to claim 1, wherein said liquid-drop applying means is pivotable about a rotational axis positioned such that the liquid-drop is swept spirally over the surface of the substrate when the liquid-drop applying means and the substrate are rotated.

6. The apparatus according to claim 5, wherein said liquid drop preserving means is circular and has a plurality of recesses along a periphery thereof.

7. The apparatus according to claim 1, further comprising control means for operating said semiconductor treatment apparatus, said control means being located outside of said housing.

8. A semiconductor treatment apparatus for recovering impurities from a surface of a semiconductor substrate, comprising:
    gas-phase decomposing means for dissolving a surface of a semiconductor substrate by exposing the semiconductor substrate to a vapor;
    substrate supporting means for supporting the substrate;
    substrate transfer means for transferring the substrate between said gas-phase decomposing means and said substrate supporting means;
    means for discharging a liquid-drop;
    retaining means for retaining the liquid-drop that has been discharged;
    liquid-drop applying means for sweeping the surface of the substrate by use of the liquid drop retained by the retaining means, when the substrate is supported by the substrate supporting means, such that said liquid-drop remains in contact with both the retaining means and the substrate during sweeping;
    liquid-drop preserving means for preserving for subsequent impurity analysis the liquid-drop after it has been swept across the surface of said substrate; and
    a housing in which said gas-phase decomposing means, said substrate supporting means, said substrate transfer means, said means for discharging, said retaining means, said liquid-drop applying means, and said liquid-drop preserving means are housed.

9. The apparatus according to claim 8, wherein said substrate supporting means is a vacuum chuck.

10. The apparatus according to claim 8, wherein said liquid-drop means is a bar which is pivotal at one end and which has a support portion at another end.

11. The apparatus according to claim 8, wherein said liquid-drop preserving means is circular and has a plurality of recesses along a periphery thereof.

12. The apparatus according to claim 8, wherein said liquid-drop applying means supports the retaining means for retaining the liquid-drop by virtue of surface tension and is pivotable about a rotational axis positioned such that the liquid-drop is swept spirally over the surface of the substrate when the liquid-drop applying means and the substrate are rotated.

13. The apparatus according to claim 12, wherein said liquid drop preserving means is circular and has a plurality of recesses along a periphery thereof.

14. The apparatus according to claim 8, further comprising control means for operating said semiconductor treatment apparatus, said control means being located outside of said housing.

* * * * *